US008692386B2

(12) United States Patent
Akamatsu

(10) Patent No.: US 8,692,386 B2
(45) Date of Patent: Apr. 8, 2014

(54) SEMICONDUCTOR DEVICE, METHOD OF MANUFACTURING SEMICONDUCTOR DEVICE, AND ELECTRONIC DEVICE

(75) Inventor: Toshiya Akamatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/327,120

(22) Filed: Dec. 15, 2011

(65) Prior Publication Data

US 2012/0193782 A1 Aug. 2, 2012

(30) Foreign Application Priority Data

Jan. 31, 2011 (JP) ................................. 2011-017405

(51) Int. Cl.
*H01L 23/48* (2006.01)
*H01L 23/52* (2006.01)
*H01L 29/40* (2006.01)

(52) U.S. Cl.
USPC ............................ 257/777; 257/778; 438/108

(58) Field of Classification Search
USPC ............................ 257/777, 778, 737; 438/108
See application file for complete search history.

(56) References Cited

U.S. PATENT DOCUMENTS

| 5,489,804 | A | * | 2/1996 | Pasch | 257/778 |
| 5,821,624 | A | * | 10/1998 | Pasch | 257/776 |
| 6,204,163 | B1 | * | 3/2001 | Panchou et al. | 438/613 |
| 6,458,623 | B1 | * | 10/2002 | Goldmann et al. | 438/107 |
| 6,627,998 | B1 | * | 9/2003 | Caletka et al. | 257/778 |
| 6,875,921 | B1 | * | 4/2005 | Conn | 174/534 |
| 8,106,518 | B2 | | 1/2012 | Kawashita et al. | |
| 2003/0209813 | A1 | * | 11/2003 | Azuma | 257/797 |
| 2004/0119169 | A1 | * | 6/2004 | Hanawa | 257/774 |
| 2010/0013108 | A1 | * | 1/2010 | Gibson et al. | 257/777 |
| 2010/0032808 | A1 | * | 2/2010 | Ding et al. | 257/621 |
| 2010/0102428 | A1 | * | 4/2010 | Lee et al. | 257/686 |
| 2012/0126419 | A1 | * | 5/2012 | Kripesh et al. | 257/774 |

FOREIGN PATENT DOCUMENTS

| JP | 11-163044 | | 6/1999 |
| JP | 2000-286304 | | 10/2000 |
| JP | 2001-94044 | A | 4/2001 |
| JP | 2003-282816 | | 10/2003 |
| JP | 2006-286677 | | 10/2006 |
| JP | 2007-180529 | A | 7/2007 |
| JP | 2008-258522 | | 10/2008 |
| JP | 2010-147281 | | 7/2010 |
| WO | WO2010-011177 | * | 1/2010 |
| WO | WO 2010/011177 | A1 | 1/2010 |
| WO | WO-2010/011177 | A1 | 1/2010 |

OTHER PUBLICATIONS

Korean Office Action mailed May 16, 2013 for corresponding Korean Application No. 10-2012-1620 with Partial English-language Translation.
Japanese Office Action mailed Feb. 18, 2014 for corresponding Japanese Application No. 2011-017405, with partial English-language translation.

* cited by examiner

*Primary Examiner* — Fernando L Toledo
*Assistant Examiner* — Karen Kusumakar
(74) *Attorney, Agent, or Firm* — Fujitsu Patent Center

(57) ABSTRACT

A semiconductor device includes a semiconductor element and an electronic element. The semiconductor element has a first protruding electrode, and the electronic element has a second protruding electrode. A substrate is disposed between the semiconductor element and the electronic element. The substrate has a through-hole in which the first and second protruding electrodes are fitted. The first and second protruding electrodes are connected together inside the through-hole of the substrate.

20 Claims, 37 Drawing Sheets

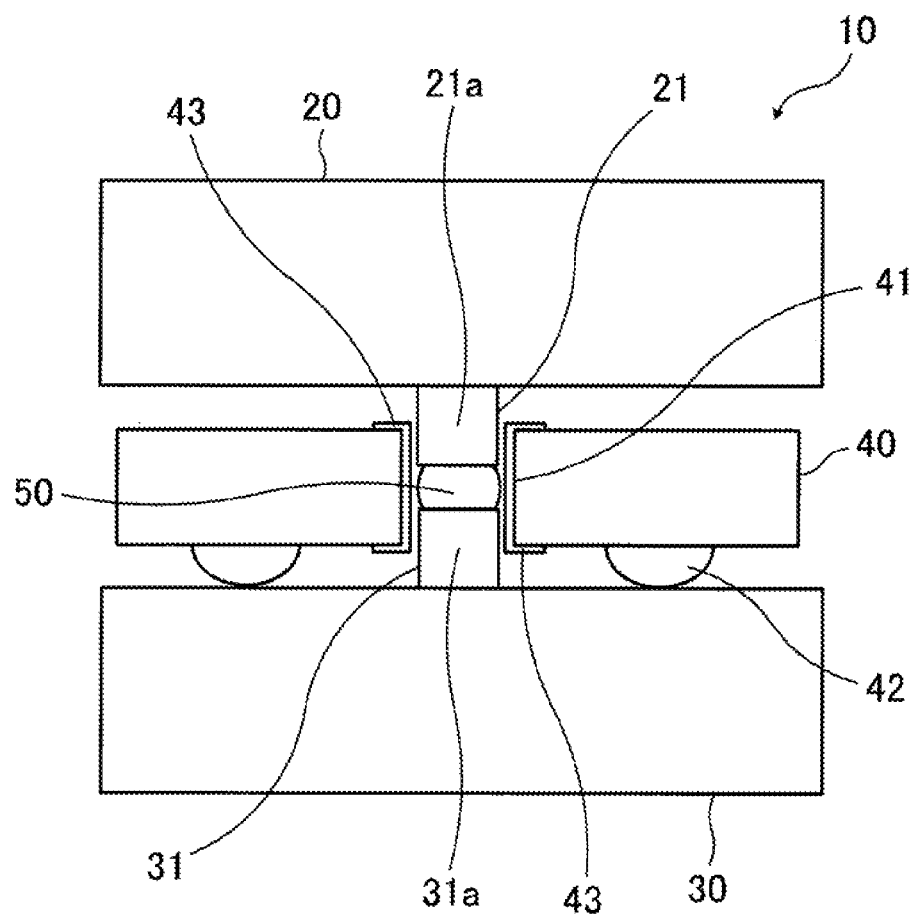

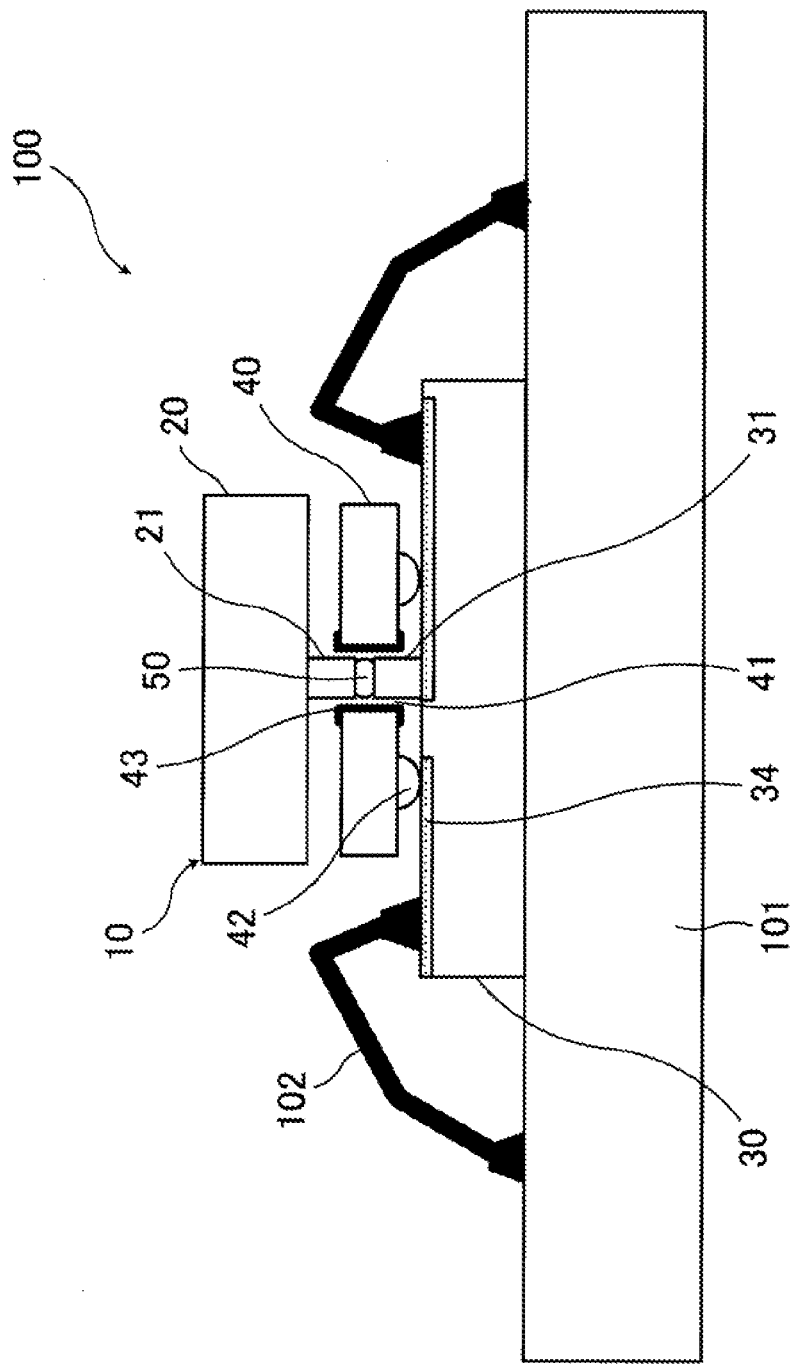

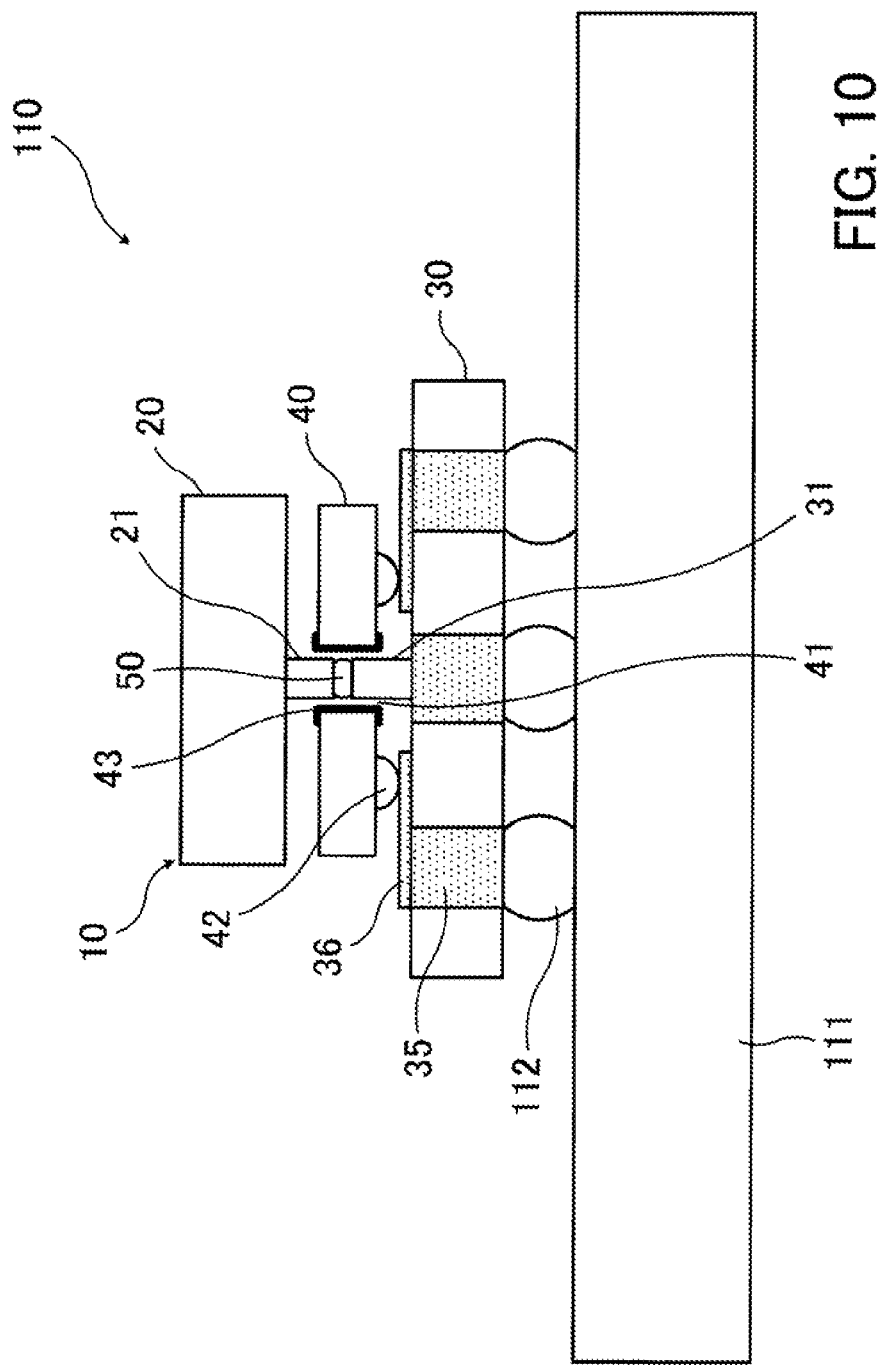

SEMICONDUCTOR DEVICE, METHOD OF MANUFACTURING SEMICONDUCTOR DEVICE, AND ELECTRONIC DEVICE

CROSS-REFERENCE TO RELATED APPLICATION

This application is based upon and claims the benefit of priority of the prior Japanese Patent Application No. 2011-017405, filed on Jan. 31, 2011, the entire contents of which are incorporated herein by reference.

FIELD

The embodiments discussed herein are related to semiconductor devices, methods of manufacturing semiconductor devices, and electronic devices using semiconductor devices.

BACKGROUND

Flip-chip bonding is a method of connecting semiconductor elements (semiconductor chips) to circuit boards. In flip-chip bonding, for example, protruding electrodes (connecting terminals) such as solder bumps are formed on either or both semiconductor elements and circuit boards so as to connect the semiconductor elements and the circuit board together using the protruding electrodes. Recently, such flip-chip bonding has been applied to semiconductor devices having a chip-on-chip structure in which a chip is stacked on and connected to another chip.

For a semiconductor device having the chip-on-chip structure, a chip having connecting terminals may be flip-chip bonded to another chip having feedthrough vias such that the connecting terminals are connected to the feedthrough vias (see, for example, Japanese Laid-open Patent Publication No. 2007-180529)

In flip-chip bonding for connecting protruding electrodes of a semiconductor element to those of a circuit board or those of an electronic element such as a semiconductor element, displacement of the protruding electrodes may occur, which in turn causes connection failures such as unconnected states and short circuits. For example, such connection failures may occur because of lateral displacement between the semiconductor element and the electronic element to which the semiconductor element is connected, that is, displacement of the protruding electrodes of one of the semiconductor element and the electronic element to the sides of the protruding electrodes of the other element, and rotational displacement between the semiconductor element and the electronic element in directions parallel to the faces of the elements.

SUMMARY

According to one aspect of the present invention, a semiconductor device includes a first semiconductor element having a first protruding electrode, an electronic element having a second protruding electrode, and a substrate disposed between the first semiconductor element and the electronic element. The substrate has a first through-hole, and the first protruding electrode and the second protruding electrode are connected together inside the first through-hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates a second example semiconductor device according to the first embodiment;

FIG. 9 illustrates an example structure of a first electronic device;

FIG. 10 illustrates an example structure of a second electronic device;

DESCRIPTION OF EMBODIMENTS

Figure 1:
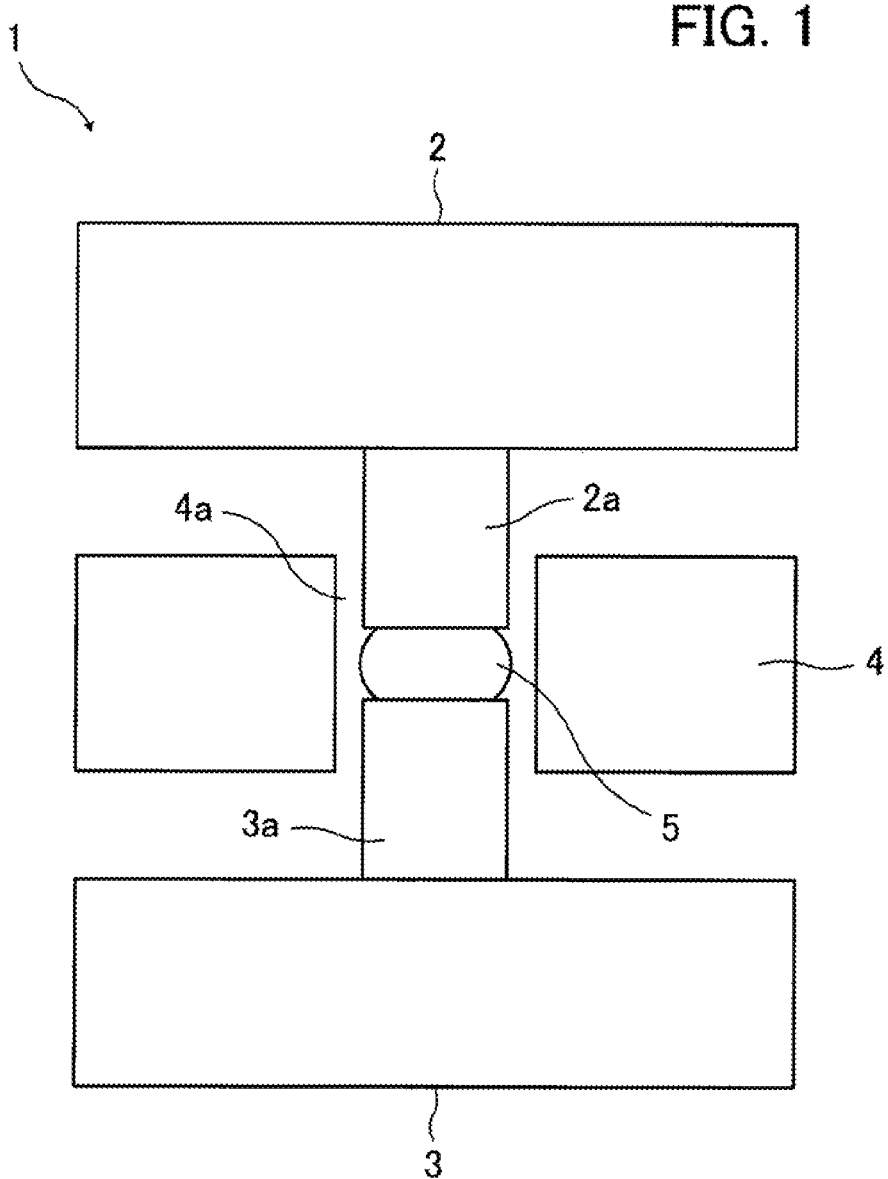
FIG. 1 illustrates an example structure of a semiconductor device.

Embodiments of the present invention will be explained below with reference to the accompanying drawings, wherein like reference numerals refer to like elements throughout.

FIG. 1 illustrates an example structure of a semiconductor device. FIG. 1 is a schematic cross-section of a principal part of the semiconductor device.

A semiconductor device 1 illustrated in FIG. 1 includes a semiconductor element 2, an electronic element 3, and a substrate 4.

The semiconductor element 2 is, for example, a semiconductor chip, and has a protruding electrode 2a on at least one of the faces thereof. The electronic element 3 is, for example, a semiconductor element (semiconductor chip) or a circuit board, and has a protruding electrode 3a on at least one of the faces thereof.

The substrate 4 is a tabular member, and is formed of, for example, a semiconductor element, a circuit board, a resin substrate, or a ceramic substrate. The substrate 4 has a through-hole 4a at a predetermined position thereof, and the through-hole 4a is sufficiently large for the protruding electrodes 2a and 3a to be fitted into the through-hole 4a.

The protruding electrode 2a of the semiconductor element 2 and the protruding electrode 3a of the electronic element 3 are connected together inside the through-hole 4a of the substrate 4 by a connecting portion 5 such as solder.

The connection between the opposing protruding electrodes 2a and 3a inside the through-hole 4a of the substrate 4 reduces the risk of lateral displacement of the protruding electrodes 2a and 3a with respect to each other in the semiconductor device 1. The connection between the opposing protruding electrodes 2a and 3a inside the through-hole 4a also reduces the risk of short circuits between the protruding electrodes 2a and 3a and other electrodes even when the other electrodes are formed adjacent to the protruding electrodes 2a and 3a.

Since the risks of lateral displacement and short circuits between the semiconductor element 2 and the electronic element 3 are reduced as described above, reliability of connections between the semiconductor element 2 and the electronic element 3 in the semiconductor device 1 is improved.

The semiconductor device will now be described in more detail.

First, a first embodiment will be described.

Herein, a semiconductor device having the so-called chip-on-chip structure in which protruding electrodes of two semiconductor elements are connected together will be described in detail with reference to the drawings.

Figure 2A:
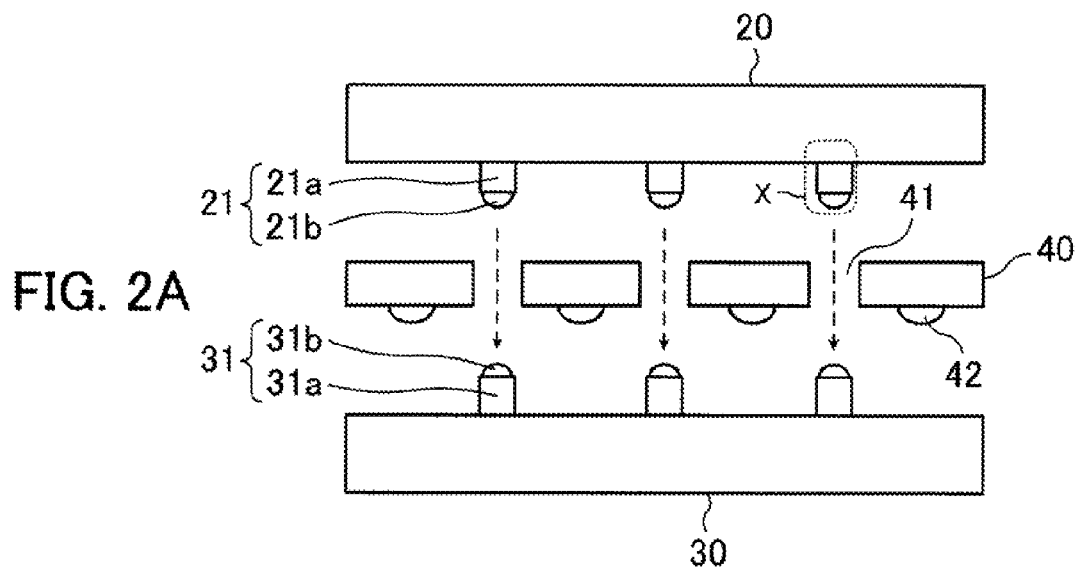
FIGS. 2A to 2C illustrate a first example semiconductor device according to a first embodiment.
Figure 2B:
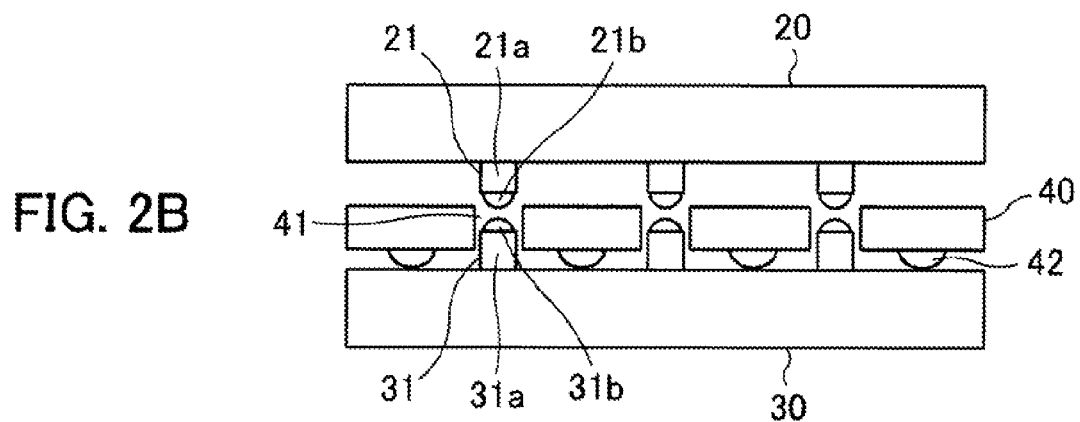
Figure 2C:
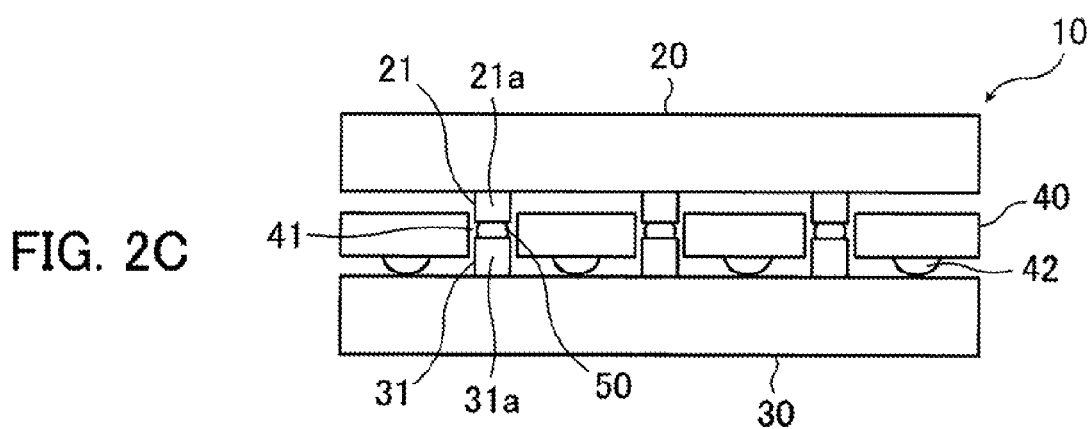

FIGS. 2A to 2C illustrate an example semiconductor device according to the first embodiment. FIGS. 2A and 2B are schematic cross-sections of a principal part illustrating example states before protruding electrodes are connected together, and FIG. 2C is a schematic cross-section of the principal part illustrating an example state after the protruding electrodes are connected together.

A semiconductor device 10 illustrated in FIG. 2C includes two semiconductor elements 20 and 30 and a semiconductor element 40 disposed therebetween. The semiconductor elements 20 and 30 have protruding electrodes 21 and 31, respectively, to be connected together.

As illustrated in FIG. 2A, the semiconductor element 20 has at least one protruding electrode 21, herein three protruding electrodes 21, formed on one of the faces at predetermined positions. The protruding electrodes 21 before being connected to the opposing protruding electrodes 31 of the semiconductor element 30 each have a post portion 21a composed of, for example, copper (Cu) and extending from the face of the semiconductor element 20 and a solder portion 21b formed at the end of the post portion 21a. The solder portions 21b are heat-treated so as to have a hemispherical shape.

Similarly, the semiconductor element 30 has at least one protruding electrode 31, herein three protruding electrodes 31, formed on one of the faces. The protruding electrodes 31 before being connected to the opposing protruding electrodes 21 of the semiconductor element 20 each have a post portion 31a composed of, for example, Cu and extending from the face of the semiconductor element 30 and a solder portion 31b formed at the end of the post portion 31a. The solder portions 31b are heat-treated so as to have a hemispherical shape. The protruding electrodes 31 of the semiconductor element 30 are formed at positions corresponding to those of the protruding electrodes 21 of the semiconductor element 20.

The protruding electrodes 21 of the semiconductor element 20 and the protruding electrodes 31 of the semiconductor element 30 are so-called post electrodes (pillar electrodes).

Figure 3:
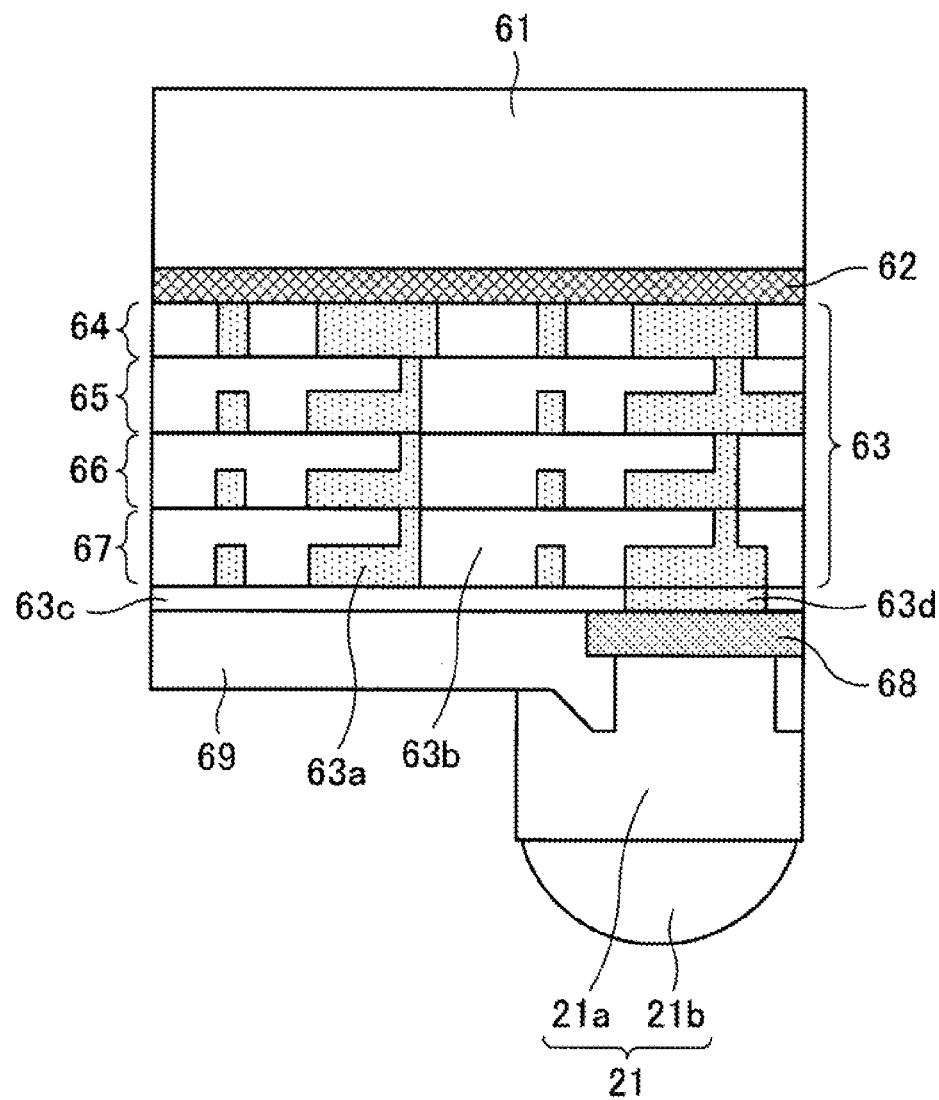
FIG. 3 illustrates an example structure of a protruding electrode and the vicinity thereof.

FIG. 3 illustrates an example structure of one of the protruding electrodes and the vicinity thereof. FIG. 3 schematically illustrates an example structure of an X part of the semiconductor element 20 illustrated in FIG. 2A.

The semiconductor element 20 includes a semiconductor substrate 61 such as a silicon (Si) substrate and an element region 62 formed on an outer most layer of the semiconductor substrate 61. Elements such as transistors are formed in the element region 62. A wiring layer 63 is disposed on the semiconductor substrate 61 with the element region 62 interposed therebetween. The wiring layer 63 includes conductive portions (wiring lines, vias) 63a electrically connected to the elements formed in the element region 62 and insulating portions 63b that cover the conductive portions 63a. Herein, the wiring layer 63 is a laminate of, for example, a first wiring layer 64, a second wiring layer 65, a third wiring layer 66, and a fourth wiring layer 67. An electrode 68 composed of, for example, aluminum (Al) and a protective film 69 formed of one or more layers and partially covering the electrode 68 are disposed on the wiring layer 63 with an insulating portion 63c interposed therebetween. The insulating portion 63c includes a conductive portion 63d, and the electrode 68 is disposed on the conductive portion 63d. The protruding electrode 21 including the post portion 21a and the solder portion 21b is formed so as to be connected to the electrode 68 exposed through the protective film 69.

Although FIG. 3 illustrates the structure of only the X part in FIG. 2A, the other parts including the other protruding electrodes 21 of the semiconductor element 20 may also have similar structures. In addition, parts including the protruding electrodes 31 of the semiconductor element 30 may also have similar structures.

As illustrated in FIG. 2A, the semiconductor element 40 disposed between the semiconductor elements 20 and 30 has through-holes 41 (herein three) at positions corresponding to those of the protruding electrodes 21 and 31. Furthermore, the semiconductor element 40 has a plurality of bumps 42 composed of, for example, solder and formed on a face opposing the semiconductor element 30. The bumps 42 herein have, for example, a hemispherical shape.

The semiconductor element 40 does not necessarily function as part of circuits in the semiconductor device 10. When the semiconductor element 40 does not function as the part of the circuits, that is, when the semiconductor element 40 is a dummy element, the bumps 42 of the semiconductor element 40 are not used as terminals for electrical connection (terminals connected to the lower semiconductor element 30 in the example illustrated in FIGS. 2A to 2C).

In order to form the semiconductor device 10 as illustrated in FIG. 2C, the upper semiconductor element 20, the lower semiconductor element 30, and the intermediate semiconductor element 40 as illustrated in FIG. 2A are prepared first.

Subsequently, the intermediate semiconductor element 40 is positioned such that the face on which the bumps 42 are formed opposes the face of the lower semiconductor element 30 on which the protruding electrodes 31 are formed, and the protruding electrodes 31 of the semiconductor element 30 and the through-holes 41 of the semiconductor element 40 are aligned. After the alignment, the semiconductor element 40 is mounted over the semiconductor element 30 such that the protruding electrodes 31 are fitted in the through-holes 41 as illustrated in FIG. 2B.

The thickness of the semiconductor element 40 including that of the bumps 42 is set such that end portions of the post portions 31a and the solder portions 31b of the protruding electrodes 31 are accommodated in the through-holes 41 without protruding from the through-holes 41 when the semiconductor element 40 is mounted over the semiconductor element 30 as described above. Alternatively, the height of the post portions 31a and the height of the solder portions 31b are set such that the end portions of the post portions 31a and the solder portions 31b are accommodated in the through-holes 41 without protruding from the through-holes 41.

All the bumps 42 of the semiconductor element 40 may be in contact with the face of the semiconductor element 30. Alternatively, one or more bumps 42 may be separated from the face of the semiconductor element 30. In this example, all the bumps 42 are in contact with the face of the semiconductor element 30. Due to the bumps 42, the semiconductor element 40 is brought into point-contact with the semiconductor element 30 at the positions of the bumps 42. This facilitates insertion of the protruding electrodes 31 into the through-holes 41 such that the end portions of the protruding electrodes 31 including the solder portions 31b are accommodated in the through-holes 41 compared with the case where the entire protruding electrodes 31 are fitted into the through-holes 41 of the semiconductor element 40 without the bumps 42. For example, the protruding electrodes 31 are easily fitted into the through-holes 41 such that the end portions of the protruding electrodes 31 including the solder portions 31b are accommodated in the through-holes 41 even when the flatness of the semiconductor element 30 differs from that of the semiconductor element 40 or the shape of some of the through-holes 41 slightly differs from that of the other through-holes 41.

After the semiconductor element 40 is mounted over the semiconductor element 30, the semiconductor element 20 is positioned such that the face on which the protruding electrodes 21 are formed opposes the through-holes 41 and the face of the semiconductor element 30 on which the protruding electrodes 31 are formed, and the protruding electrodes 31, the through-holes 41, and the protruding electrodes 21 of the semiconductor element 20 are aligned as illustrated in FIG. 2B. After the alignment, the semiconductor element 20 is mounted over the semiconductor elements 30 and 40 such that the protruding electrodes 21 of the semiconductor element 20 are fitted in the through-holes 41.

The semiconductor element 40 is disposed such that the protruding electrodes 31 do not protrude from the through-holes 41, and the protruding electrodes 21 are fitted into upper spaces remaining inside the through-holes 41. The thickness of the semiconductor element 40 including that of the bumps 42 is set such that end portions of the post portions 21a and the solder portions 21b of the protruding electrodes 21 are accommodated in the space of the through-holes 41. Alternatively, the height of the post portions 21a and the height of the solder portions 21b are set such that the end portions of the post portions 21a and the solder portions 21b are accommodated in the through-holes 41. With this, the end portions of the protruding electrodes 21 including the solder portions 21b and the end portions of the protruding electrodes 31 including the solder portions 31b are accommodated in the through-holes 41.

The solder portions 21b and 31b are reflowed in this state to be integrated into connecting portions 50, and the semiconductor elements 20 and 30 are connected together by the connecting portions 50 and the post portions 21a and 31a. At this moment, the end portions of the post portions 21a and 31a and the connecting portions are located inside the through-holes 41 of the semiconductor element 40 disposed between the semiconductor elements 20 and 30.

In the above-described method of forming the semiconductor device 10, the protruding electrodes 21 of the semiconductor element 20 are fitted into the through-holes 41 of the semiconductor element 40 while the protruding electrodes 31 of the semiconductor element 30 are disposed so as not to protrude from the through-holes 41. This allows the protruding electrodes 21 and 31 to oppose each other inside the through-holes 41, and reduces the risk of lateral displacement of the protruding electrodes 21 and 31 before the solder portions are reflowed. Furthermore, the risk of rotational displacement (θ direction as illustrated in FIG. 5) of the semiconductor elements 20 and 30 before the reflow soldering is also reduced.

Figure 4A:
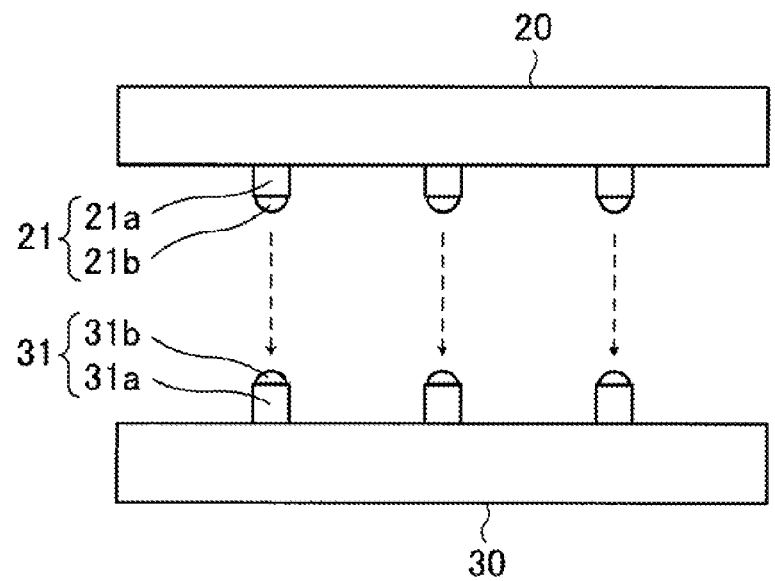
FIGS. 4A and 4B illustrate a first case where no intermediate semiconductor element is used.
Figure 4B:
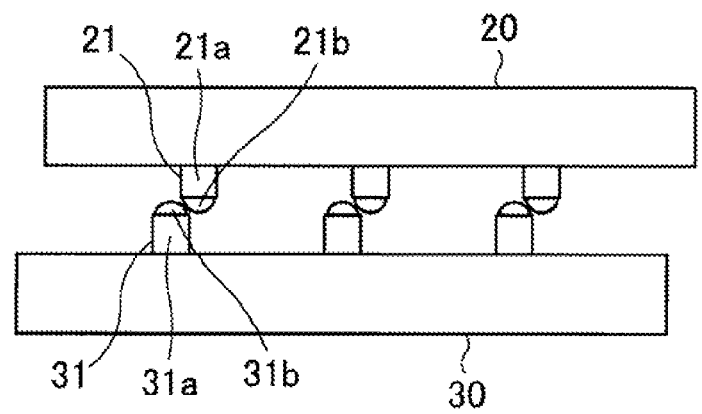
Figure 5:
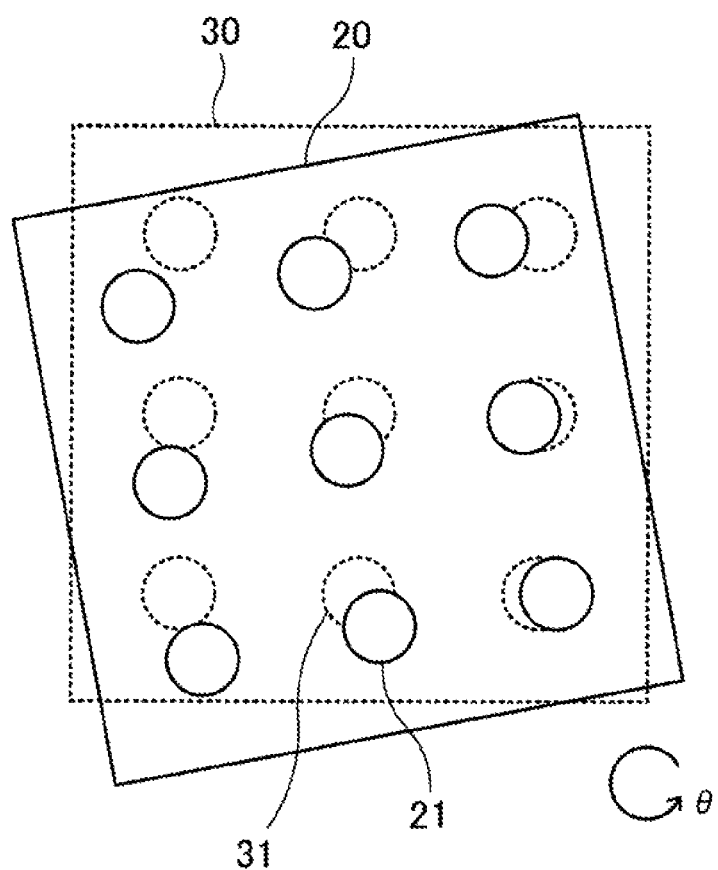
FIG. 5 illustrates a second case where no intermediate semiconductor element is used.

FIGS. 4A to 6B illustrate a case where no intermediate semiconductor element is used. FIGS. 4A, 4B, 6A, and 6B are schematic cross-sections of principal parts of the semiconductor elements to be connected, and FIG. 5 is a schematic plan view of a principal part of the semiconductor elements to be connected.

When the semiconductor element 40 having the above-described through-holes 41 is not used, the protruding electrodes 21 of the semiconductor element 20 and the protruding electrodes 31 of the semiconductor element 30 are aligned as illustrated in FIG. 4A first. Subsequently, the solder portions 21b of the protruding electrodes 21 and the solder portions 31b of the protruding electrodes 31 are brought into contact with each other, and are reflowed. Since the solder portions 21b at the ends of the protruding electrodes 21 and the solder portions 31b at the ends of the protruding electrodes 31 are, for example, hemispherical, lateral displacement may occur between the semiconductor elements 20 and 30 as illustrated in FIG. 4B due to the weight of the semiconductor element 20, vibration, or other reasons before the convex faces of the protruding electrodes 21 and 31 are brought into contact with each other and the solder is melt during reflow soldering. In addition to the lateral displacement, displacement in the θ direction as illustrated in FIG. 5 may occur between the semiconductor elements 20 and 30 (the semiconductor element 30 is indicated by dotted lines).

Figure 6A:
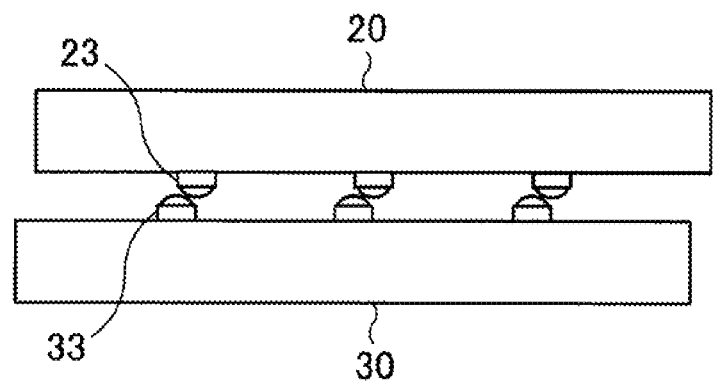
FIGS. 6A and 6B illustrate a third case where no intermediate semiconductor element is used.
Figure 6B:
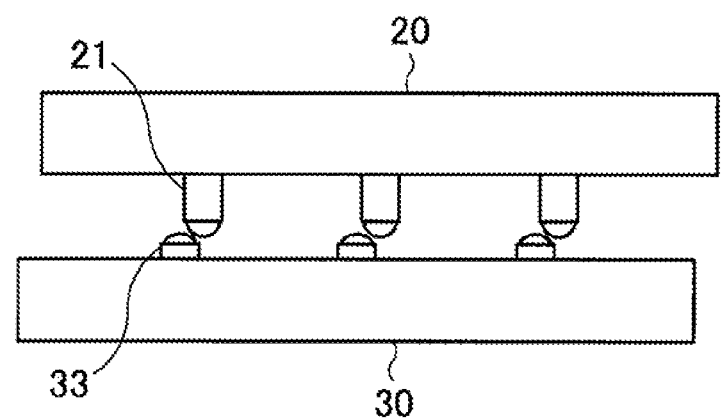

The lateral displacement or the displacement in the θ direction may also occur when protruding electrodes 23 and 33 with small heights such as so-called micro-bumps are formed on both semiconductor elements 20 and 30, respectively, as illustrated in FIG. 6A. In addition, the above-described displacement may also occur when protruding electrodes 33 with a small height are formed on either the semiconductor element 20 or the semiconductor element 30 (for example, on the semiconductor element 30 as illustrated in FIG. 6B). The displacement between the semiconductor elements 20 and 30 may also occur due to, for example, vibration as described above even when the solder portions 21b of the protruding electrodes 21 and the solder portions 31b of the protruding electrodes 31 are not hemispherical.

In contrast, the above-described semiconductor device 10 uses the semiconductor element 40 having the through-holes 41, and the semiconductor elements 20 and 30 are positioned such that the protruding electrodes 21 and 31 are fitted into the through-holes 41 and connected inside the through-holes 41 during the formation of the semiconductor device 10. This effectively reduces the risks of the lateral displacement of the protruding electrodes 21 and 31 and the displacement of the semiconductor elements 20 and 30 in the θ direction before the solder portions are reflowed.

Furthermore, the connection of the protruding electrodes 21 and 31 inside the through-holes 41 reduces the risk of short circuits between adjacent sets of the post portion 21a, the post portion 31a, and the connecting portion 50, which are placed adjacent to each other, after the solder portions are reflowed.

In addition, since the semiconductor device 10 uses post electrodes as the protruding electrodes 21 and 31, the connecting portions 50 and the faces of the semiconductor elements 20 and 30 are separated from each other by distances corresponding to the lengths of the protruding electrodes 21 and 31, respectively. As a result, shear stress applied to the connecting portion 50 during reflow soldering or while the semiconductor device 10 is operating is reduced.

Although the example structure of the semiconductor device 10 and the example method of forming the semiconductor device 10 have been described above, the structures of the semiconductor elements 20, 30, and 40 used in the semiconductor device 10 are not limited to those described above. For example, the sizes of the semiconductor elements 20 and 30 and the numbers and the layouts of the protruding electrodes 21 of the semiconductor element 20 and the protruding electrodes 31 of the semiconductor element 30 are not limited to those described above. The size of the semiconductor element 40, the number and the layout of the through-holes 41, and the number and the layout of the bumps 42 are also not limited to those described above. Although not illustrated, rewiring lines connected to the protruding electrodes 21 and 31 may be formed on the faces of the semiconductor elements 20 and 30.

The semiconductor element 40 used in the semiconductor device 10 will now be described in more detail.

FIG. 7 illustrates another example semiconductor device according to the first embodiment. FIG. 7 is a schematic cross-section of a principal part of the example semiconductor device according to the first embodiment.

The through-hole 41 of the semiconductor element 40 is formed to have a diameter equal to or larger than that of the protruding electrode 21 of the semiconductor element 20 and that of the protruding electrode 31 of the semiconductor element 30 so that the protruding electrodes 21 and 31 are fitted in the through-hole 41. When the diameter of the through-hole 41 is larger than that of the protruding electrodes 21 and 31, gaps are left between the sidewall (inner wall) of the through-holes 41 and the post portions 21a and 31a and the connecting portion 50. These gaps prevent the post portions 21a and 31a and the connecting portion 50 from coming into contact with the sidewall of the through-hole 41.

If the sidewall of the through-hole 41 has a conductive region and the post portions 21a and 31a and the connecting portion 50 come into contact with the conductive region, the semiconductor device 10 may malfunction. From this point of view, the sidewall of the through-hole 41 of the semiconductor element 40 may be electrically insulated. For example, the sidewall of the through-hole 41 may be covered with an insulating film 43 as illustrated in FIG. 7. This effectively reduces the risk of electrical connection of the semiconductor element 40 with the post portions 21a and 31a and the connecting portion 50.

Although FIG. 7 illustrates a case where the insulating film 43 is formed on the sidewall of the through-hole 41 and on part of the front and rear faces of the semiconductor element 40, the insulating film 43 may be formed so as to cover at least the sidewall of the through-hole 41. In addition, the insulating film 43 may be formed on the entire front or rear face of the semiconductor element 40 except for conductive regions where conductive portions such as connecting terminals (for example, bumps 42) are formed.

In addition, a space between the semiconductor elements 20 and 30 of the semiconductor device 10 may be filled with resin such as underfill.

Figure 8:
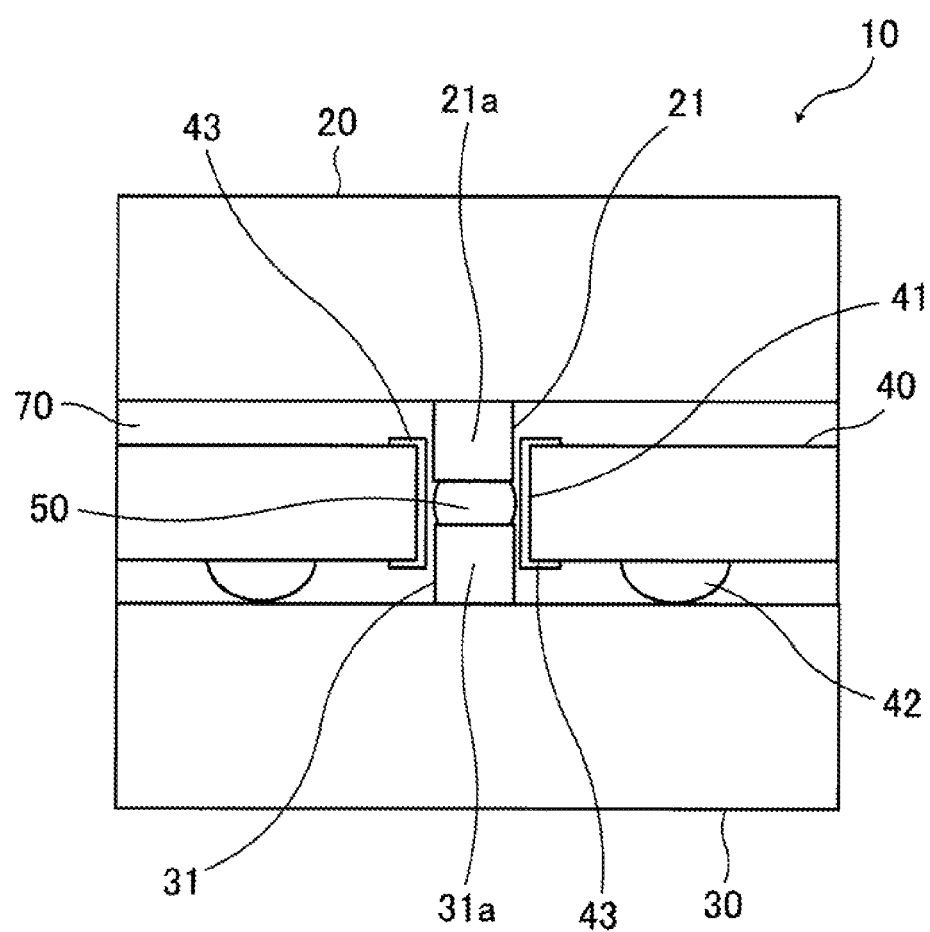
FIG. 8 illustrates a third example semiconductor device according to the first embodiment.

FIG. 8 illustrates another example semiconductor device according to the first embodiment. FIG. 8 is a schematic cross-section of a principal part of the example semiconductor device according to the first embodiment.

As illustrated in FIG. 8, a space between the semiconductor elements 20 and 30 connected inside the through-hole 41 (herein, inside the through-hole 41 whose sidewall is covered with the insulating film 43) of the semiconductor element 40 may be filled with resin 70. The resin 70 may be, for example, epoxy resin, which is often used as underfill. The space between the semiconductor elements 20 and 30 including gaps remaining inside the through-hole 41 after the protruding electrodes 21 and 31 are connected, for example, is filled with the resin 70. The resin 70 further improves the connection reliability of the semiconductor device 10 against thermal and physical stress.

The above-described semiconductor device 10 may be mounted on a circuit board.

FIGS. 9 and 10 illustrate example structures of devices (electronic devices) including circuit boards on which the semiconductor devices according to the first embodiment are mounted. FIGS. 9 and 10 are schematic cross-sections of principal parts of example electronic devices according to the first embodiment.

An electronic device 100 illustrated in FIG. 9 includes a circuit board (base substrate) 101 and a semiconductor device 10 wire-bonded on the circuit board 101. In this electronic device 100, a semiconductor element 30 connected to a semiconductor element 20 with a semiconductor element 40 interposed therebetween is electrically connected to the circuit board 101 using wires 102 composed of, for example, gold (Au). The semiconductor element 30 includes, for example, wiring lines 34 connected to a protruding electrode 31 and internal circuits of the semiconductor element 30, and the wiring lines 34 are connected to one ends of the wires 102.

The semiconductor element 40 herein may be, for example, a dummy element. In this case, bumps 42 do not function as terminals connected to the semiconductor element 30. Alternatively, the semiconductor element 40 may be a semiconductor element (active element) functioning as part of circuits in the semiconductor device 10. In this case, the bumps 42 may function as terminals connected to the semiconductor element 30. When an active element is used as the semiconductor element 40, a predetermined pattern of the wiring lines 34 is formed on the semiconductor element 30 in accordance with, for example, functions of the semiconductor element 40 or the layout of the bumps 42.

In FIG. 9, the sidewall of a through-hole 41 of the semiconductor element 40 are covered with an insulating film 43. A space between the semiconductor elements 20 and 30 may be filled with resin such as underfill. In addition, the semiconductor device 10 and the wires 102 on the circuit board 101 (including a space between the semiconductor elements 20 and 30 when the space is not filled with resin) may be sealed using resin such as sealing resin.

An electronic device 110 illustrated in FIG. 10 includes a circuit board (base substrate) 111 and a semiconductor device 10 connected to the circuit board 111 using solder balls 112. A semiconductor element 30 includes, for example, feedthrough electrodes 35 such as through-silicon vias (TSVs), and the feedthrough electrodes 35 are electrically connected to the circuit board 111 via the solder balls 112.

As in the electronic device 100 illustrated in FIG. 9, a semiconductor element 40 in the electronic device 110 illustrated in FIG. 10 may be a dummy element or an active element. When the semiconductor element 40 is an active element, bumps 42 function as terminals connected to the semiconductor element 30. A predetermined pattern according to the form of the semiconductor element 40 is formed on the semiconductor element 30. For example, wiring lines 36 that connect the bumps 42 and the feedthrough electrodes 35 as illustrated in FIG. 10 are formed on the semiconductor element 30.

In FIG. 10, the sidewall of a through-hole 41 of the semiconductor element 40 is also covered with an insulating film 43. Moreover, a space between the semiconductor elements 20 and 30 or a space between the semiconductor element 30 and the circuit board 111 may be filled with resin such as underfill. In addition, the semiconductor device 10 on the circuit board 111 (including the space between the semiconductor elements 20 and 30 and the space between the semiconductor element 30 and the circuit board 111 when the spaces are not filled with resin) may be sealed using resin.

Next, a second embodiment will be described.

In the description above, the semiconductor elements 20 and 30 are connected together with the semiconductor element 40 interposed therebetween. The semiconductor element 40 may be incorporated into a structure in which a semiconductor element and an electronic element such as a circuit board are connected together.

Figure 11A:
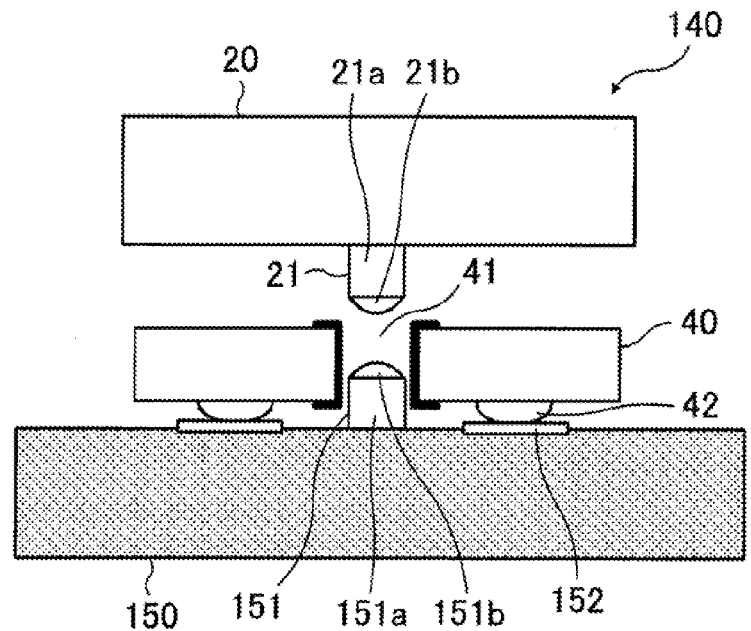
FIGS. 11A and 11B illustrate an example semiconductor device according to a second embodiment.
Figure 11B:
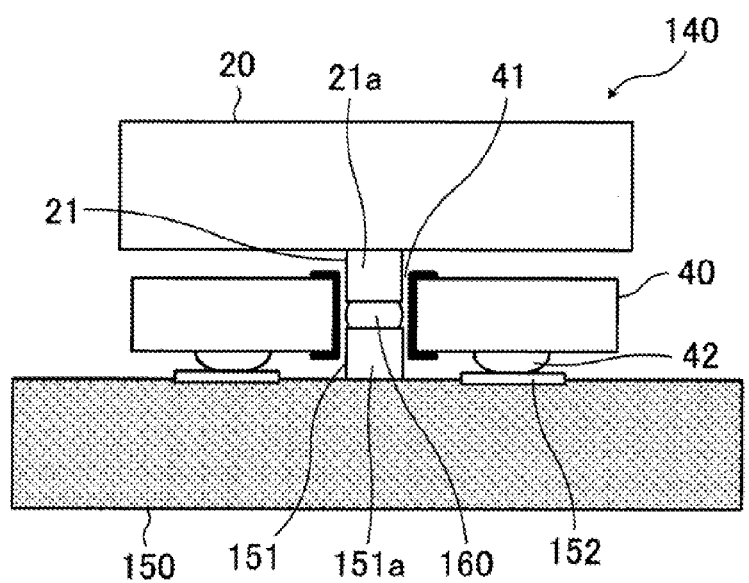

FIGS. 11A and 11B illustrate an example semiconductor device according to a second embodiment. FIG. 11A is a schematic cross-section of a principal part illustrating an example state before protruding electrodes are connected together, and FIG. 11B is a schematic cross-section of a principal part illustrating an example state after the protruding electrodes are connected together.

A semiconductor device 140 illustrated in FIGS. 11A and 11B includes a semiconductor element 20, a circuit board (base substrate) 150, and a semiconductor element 40 disposed between the semiconductor element 20 and the circuit board 150. A resin substrate, a ceramic substrate, a semiconductor substrate, or the like having predetermined patterns of conductive portions formed inside and on faces of the substrate may be used as the circuit board 150. As illustrated in FIG. 11A, a protruding electrode 151 to be connected to a protruding electrode 21 of the semiconductor element 20 is formed on the circuit board 150 at a position corresponding to that of the protruding electrode 21 (or that of a through-hole of the semiconductor element 40). The protruding electrode 151 before being connected to the protruding electrode 21 includes a post portion 151a and a hemispherical solder portion 151b formed at the end of the post portion 151a. Similarly, the protruding electrode 21 includes a post portion 21a and a hemispherical solder portion 21b formed at the end of the post position 21a.

The semiconductor element 40 is mounted on the circuit board 150 such that the protruding electrode 151 is fitted into the through-hole 41, and the protruding electrode 21 of the semiconductor element 20 is then fitted into the through-hole 41. The post portion 21a of the protruding electrode 21 and the post portion 151a of the protruding electrode 151 are connected together by a connecting portion (a portion into which the solder portions 21b and 151b are integrated) 160 as illustrated in FIG. 11B by reflowing the solder portions 21b and 151b while the protruding electrodes 21 and 151 are fitted in the through-hole 41.

Since the protruding electrodes 21 and 151 are connected inside the through-hole 41, the risk of displacement of the protruding electrodes 21 and 151 is reduced. In addition, the risk of short circuits between adjacent sets of the protruding electrodes 21 and 151 is also reduced.

The semiconductor element 40 in the electronic device 140 may be a dummy element or an active element. FIGS. 11A and 11B illustrate a case where the semiconductor element 40 is an active element, and bumps 42 are used as terminals connected to electrodes 152 formed on the circuit board 150.

In FIGS. 11A and 11B, the sidewall of the through-hole 41 of the semiconductor element 40 is covered with an insulating film 43. A space between the semiconductor element 20 and the circuit board 150 may be filled with resin such as underfill.

Next, a third embodiment will be described.

Although a substrate such as a semiconductor element 40 (dummy element or active element) having a through-hole 41 is used in the description above, a different type of substrate having similar through-holes may be used.

Figure 12:
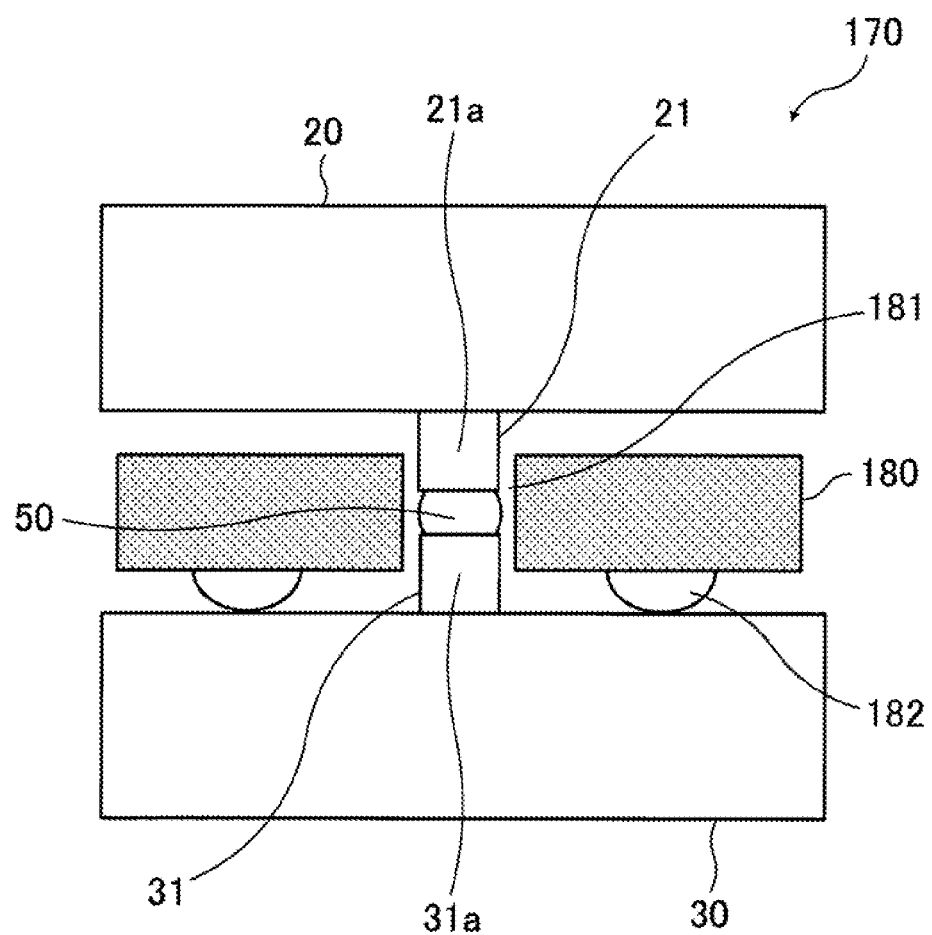
FIG. 12 illustrates a first example semiconductor device according to a third embodiment.
Figure 13:
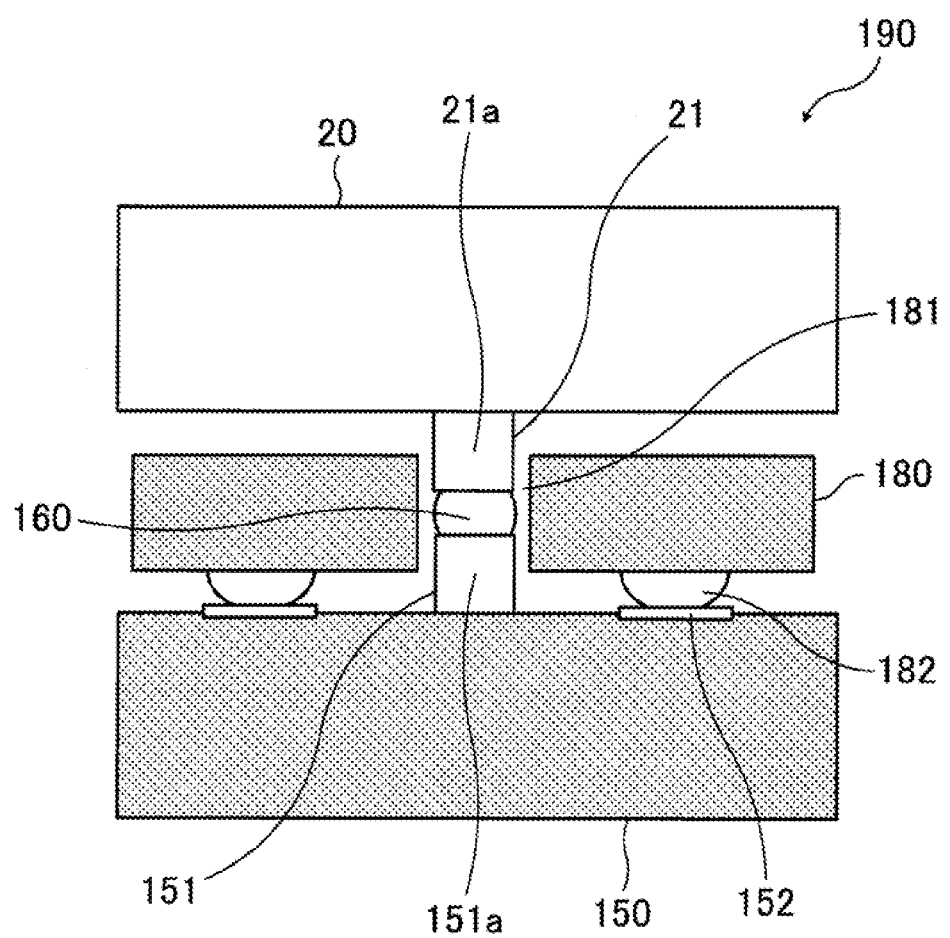
FIG. 13 illustrates a second example semiconductor device according to the third embodiment.

FIGS. 12 and 13 illustrate example semiconductor devices according to the third embodiment. FIGS. 12 and 13 are schematic cross-sections of principal parts of the example semiconductor devices according to the third embodiment.

A semiconductor device 170 illustrated in FIG. 12 includes a substrate 180 such as a resin substrate or a ceramic substrate having a through-hole 181 between semiconductor elements 20 and 30. A semiconductor device 190 illustrated in FIG. 13 includes a substrate 180 between a semiconductor element 20 and a circuit board 150.

Bumps 182 are formed on a face of the substrate 180 opposing the semiconductor element 30 in FIG. 12 and the circuit board 150 in FIG. 13. However, these bumps 182 are not necessarily formed. The substrate 180 may be, for example, a single resin substrate or single ceramic substrate. In addition, the substrate 180 may be a resin substrate, ceramic substrate, or the like having predetermined patterns of conductive portions formed inside and on faces of the substrate, namely a circuit board. In cases where the conductive portions are exposed at the sidewall of the through-hole 181 due to the form of the substrates 180 when the through-hole 181 is simply formed, the sidewall may be covered with an insulating film 43 described above.

When such a substrate 180 is used, protruding electrodes 21 and 31 in the semiconductor device 170 illustrated in FIG. 12 and protruding electrodes 21 and 151 in the semiconductor device 190 illustrated in FIG. 13 are connected inside the through-hole 181 in a manner similar to those described above. This reduces the risks of the above-described displacement and short circuits.

A space between the semiconductor elements 20 and 30 illustrated in FIG. 12 and a space between the semiconductor element 20 and the circuit board 150 illustrated in FIG. 13 may be filled with resin such as underfill.

Figure 14:
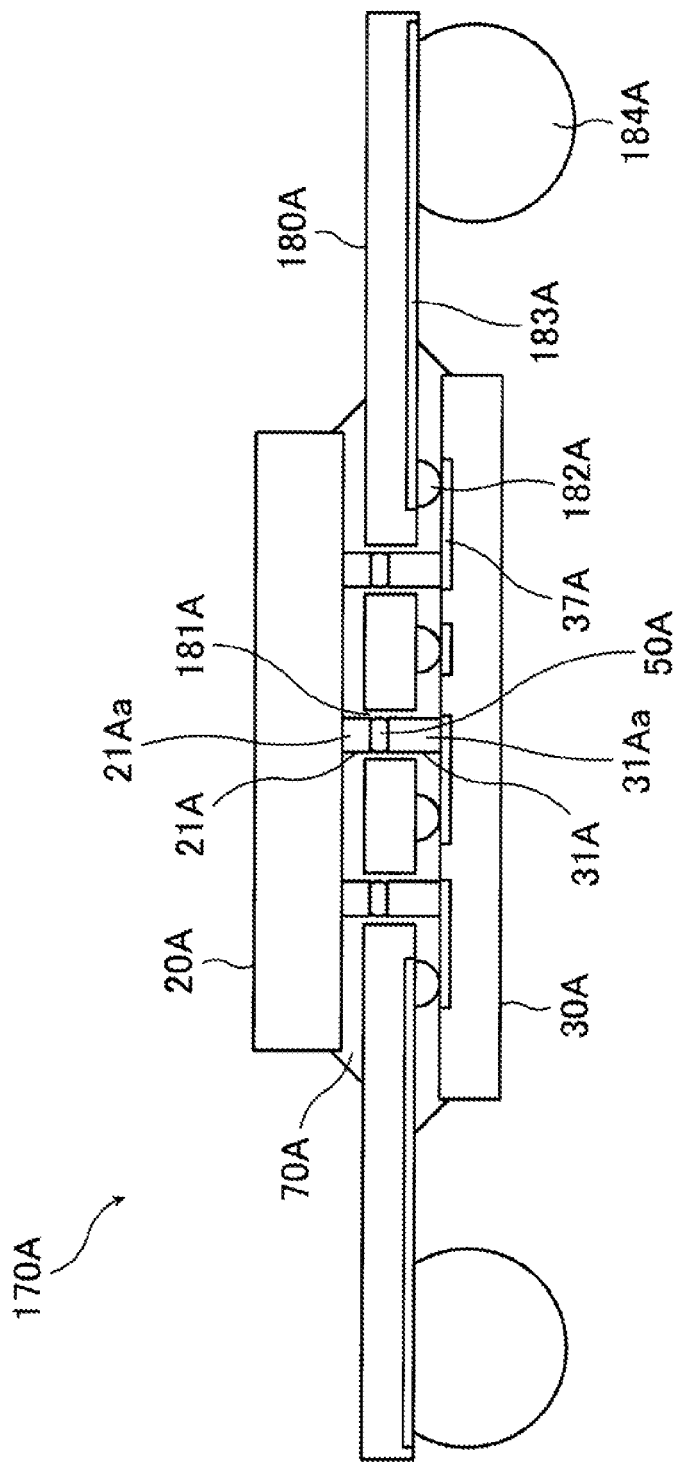
FIG. 14 illustrates an example structure of a semiconductor device according to the third embodiment.

FIG. 14 illustrates an example structure of a semiconductor device according to the third embodiment. FIG. 14 is a schematic cross-section of a principal part of an example semiconductor device according to the third embodiment.

A semiconductor device 170A illustrated in FIG. 14 includes semiconductor elements 20A and 30A and a resin substrate 180A having through-holes 181A interposed between the semiconductor elements 20A and 30A. Protruding electrodes 21A and 31A are connected inside the through-holes 181A. In the semiconductor device 170A, the semiconductor element 20A is, for example, a memory element (memory chip), and the semiconductor element 30A is, for example, a logic element (logic chip).

The resin substrate 180A has predetermined patterns of conductive portions inside and on the faces thereof, and functions as a circuit board. Among the conductive portions, wiring lines 183A formed on one of the faces of the resin substrate 180A at predetermined positions are illustrated in FIG. 14. The wiring lines 183A are connected to solder balls 184A.

Bumps 182A are formed on the face of the resin substrate 180A opposing the semiconductor element 30A. The bumps 182A are connected to the conductive portions inside the resin substrate 180A and to the wiring lines 183A on the face of the resin substrate 180A. Meanwhile, the semiconductor element 30A has wiring lines 37A formed on a face opposing the resin substrate 180A. The wiring lines 37A are connected to elements inside the semiconductor element 30A and the protruding electrodes 31A. The wiring lines 37A are connected to the bumps 182A of the resin substrate 180A.

Spaces between the semiconductor elements 20A and 30A, that is, spaces between the semiconductor element 20A and the resin substrate 180A, between the semiconductor element 30A and the resin substrate 180A, and inside the through-holes 181A are filled with resin 70A.

An electronic device including this semiconductor device 170A may be obtained by connecting the semiconductor device 170A to a circuit board using the solder balls 184A.

The semiconductor device 170A as illustrated in FIG. 14 may be formed using a method as illustrated in, for example, FIGS. 15A to 15D and 16A to 16C.

FIGS. 15A to 15D and 16A to 16C illustrate an example method of forming the semiconductor device according to the third embodiment. FIGS. 15A to 15D and 16A to 16C are schematic cross-sections of a principal part in each forming step.

Figure 15A:
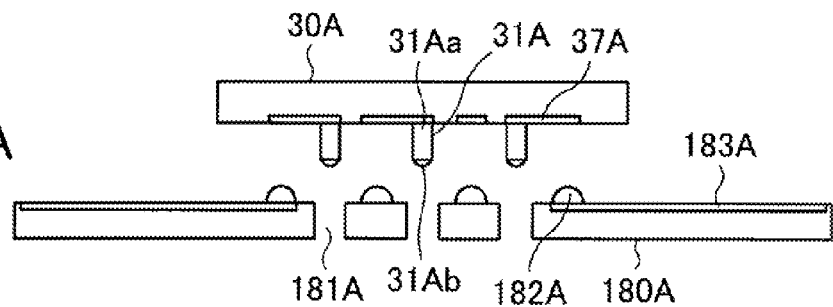
FIGS. 15A to 15D illustrate an example method of forming the semiconductor device according to the third embodiment.
Figure 15B:
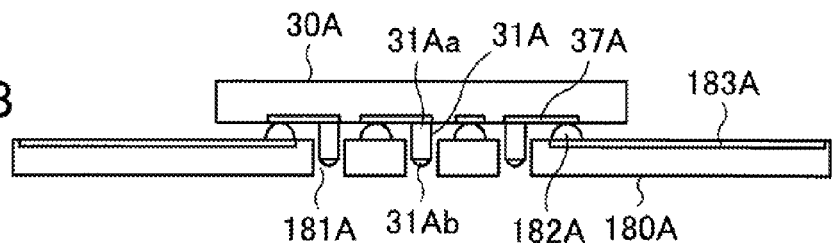

First, the semiconductor elements 20A and 30A and the resin substrate 180A are prepared. Subsequently, as illustrated in FIG. 15A, the through-holes 181A of the resin substrate 180A and the protruding electrodes 31A of the semiconductor element 30A are aligned. After the alignment, the semiconductor element 30A is mounted over the resin substrate 180A such that the protruding electrodes 31A are fitted in the through-holes 181A as illustrated in FIG. 15B. At this moment, the bumps 182A of the resin substrate 180A are connected to the wiring lines 37A of the semiconductor element 30A.

Figure 15C:
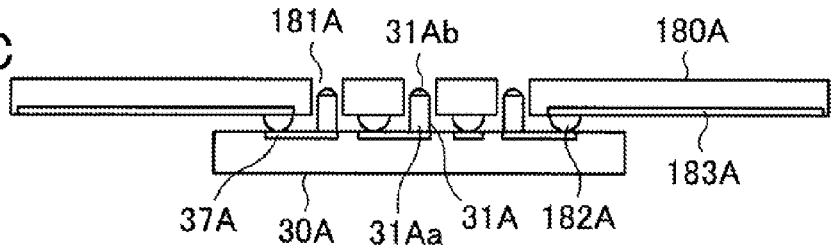
Figure 15D:
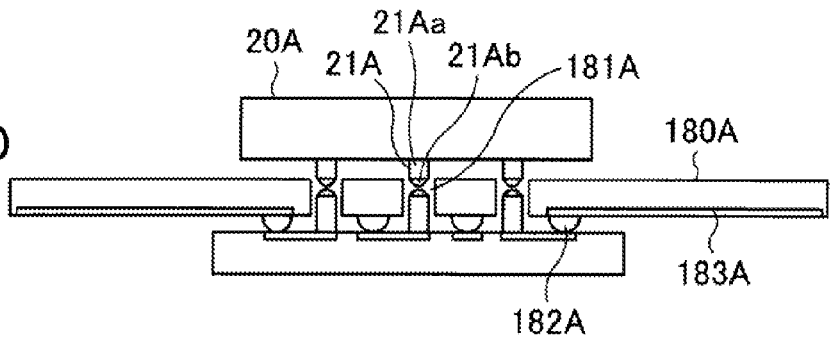
Figure 16A:
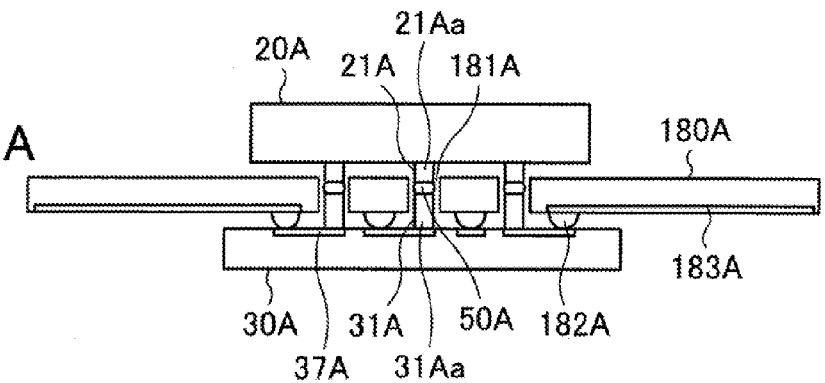
FIGS. 16A to 16C illustrate subsequent steps of the example method of forming the semiconductor device according to the third embodiment illustrated in FIGS. 15A to 15D.

Next, the orientation of the resin substrate 180A over which the semiconductor element 30A is mounted is reversed upside down as illustrated in FIG. 15C. Subsequently, the protruding electrodes 21A of the semiconductor element 20A are aligned with the through-holes 181A. After the alignment, the semiconductor element 20A is mounted over the resin substrate 180A such that the protruding electrodes 21A are fitted into the through-holes 181A in which the protruding electrodes 31A have been fitted as illustrated in FIG. 15D. The protruding electrodes 21A and 31A are connected together inside the through-holes 181A by reflowing solder portions. That is, post portion 21Aa and 31Aa are connected together inside the through-holes 181A by connecting portions 50A into which solder portions 21Ab and 31Ab (illustrated in FIGS. 15A to 15D) are integrated as illustrated in FIG. 16A.

Figure 16B:
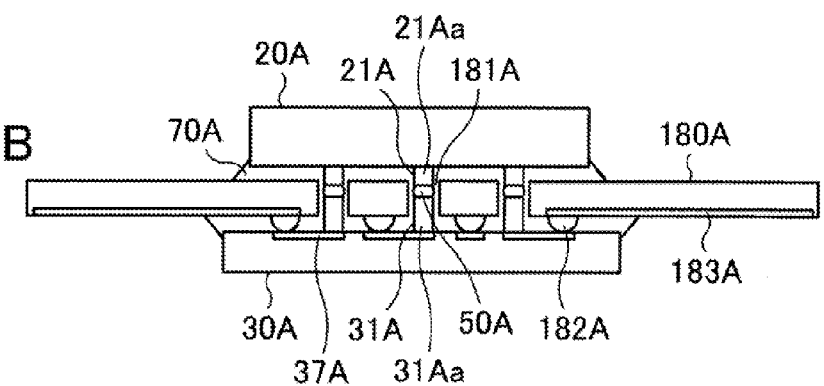

After the semiconductor elements 20A and 30A are connected together with the resin substrate 180A interposed therebetween, spaces between the semiconductor element 20A and the resin substrate 180A and between the semiconductor element 30A and the resin substrate 180A are filled with the resin 70A as illustrated in FIG. 16B. At this moment, spaces inside gaps remaining in the through-holes 181A are also filled with the resin 70A.

Figure 16C:
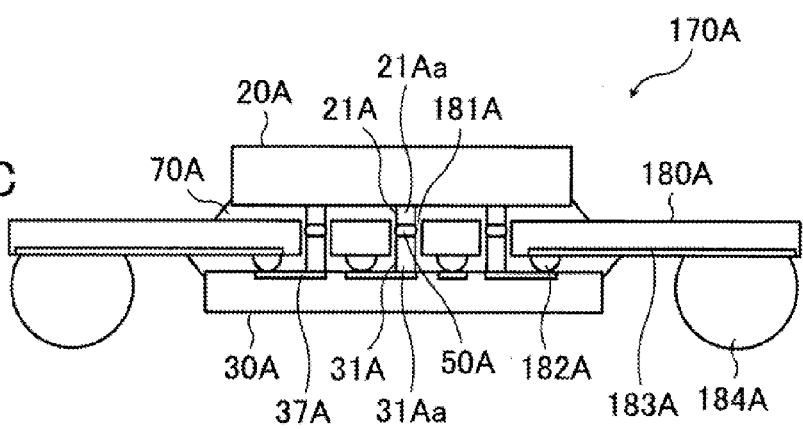

After filling the spaces with the resin 70A, the solder balls 184A are connected to the wiring lines 183A of the resin substrate 180A as illustrated in FIG. 16C. This completes the formation of the semiconductor device 170A as illustrated in FIG. 14.

In order to form an electronic device by mounting the semiconductor device 170A on a circuit board, the solder balls 184A may be used to connect the semiconductor device 170A to the circuit board.

Next, a fourth embodiment will be described.

In the description above, the protruding electrodes of the two semiconductor elements are connected together inside the through-holes of the substrate disposed between the two semiconductor elements. This structure may be applied to a case where three or more semiconductor elements are used.

Figure 17A:
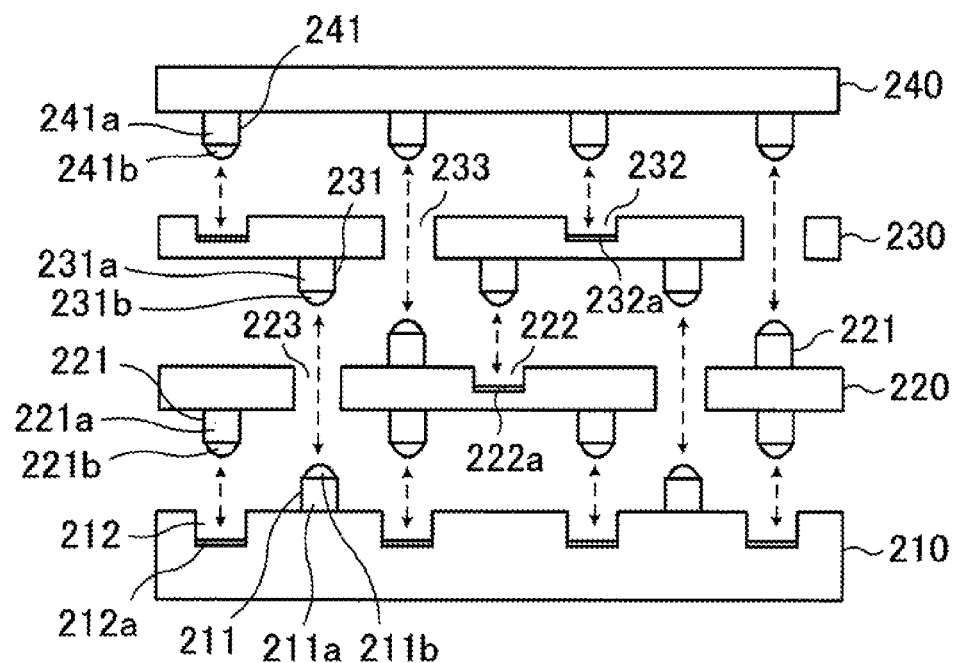
FIGS. 17A and 17B illustrate an example semiconductor device according to a fourth embodiment.
Figure 17B:
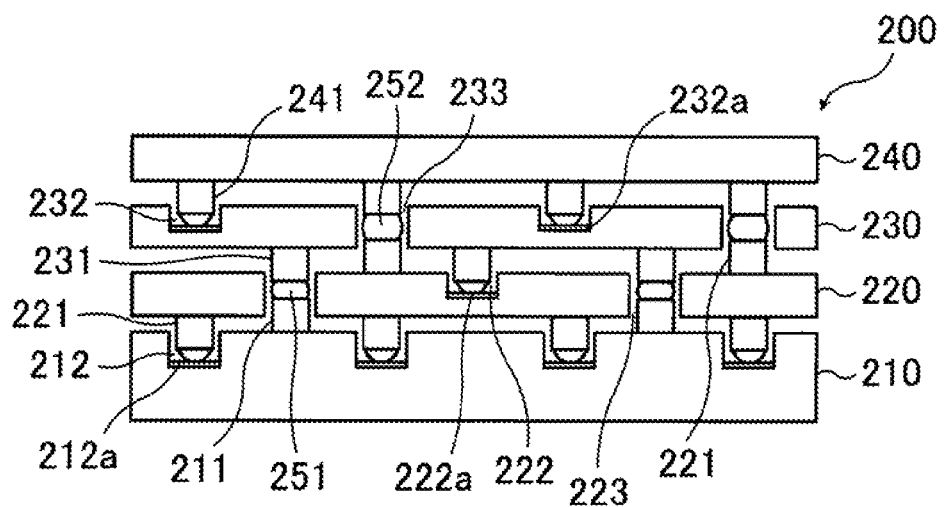

FIGS. 17A and 17B illustrate an example semiconductor device according to a fourth embodiment. FIG. 17A is a schematic cross-section of a principal part illustrating an example state before connecting semiconductor elements, and FIG. 17B is a schematic cross-section of the principal part illustrating an example state after connecting the semiconductor elements.

As illustrated in FIG. 17B, a semiconductor device 200 includes a laminate of four semiconductor elements 210, 220, 230, and 240 connected together.

As illustrated in FIG. 17A, the semiconductor element 210 of the first layer has protruding electrodes 211 formed on the upper face and recesses 212 formed in the upper face. The protruding electrodes 211 each include a post portion 211a and a hemispherical solder portion 211b formed at the end of the post portion 211a. Electrodes 212a are formed on the bottom faces of the recesses 212.

The semiconductor element 220 of the second layer has protruding electrodes 221 formed on the upper and lower faces, recesses 222 formed in the upper face, and through-holes 223 passing through the semiconductor element 220. The protruding electrodes 221 each include a post portion 221a and a hemispherical solder portion 221b formed at the end of the post portion 221a. Electrodes 222a are formed on the bottom faces of the recesses 222.

The semiconductor element 230 of the third layer has protruding electrodes 231 formed on the lower face, recesses 232 formed in the upper face, and through-holes 233 passing through the semiconductor element 230. The protruding electrodes 231 each include a post portion 231a and a hemispherical solder portion 231b formed at the end of the post portion 231a. Electrodes 232a are formed on the bottom faces of the recesses 232.

The semiconductor element 240 of the fourth layer has protruding electrodes 241 formed on the lower face. The protruding electrodes 241 each include a post portion 241a and a hemispherical solder portion 241b formed at the end of the post portion 241a.

When these semiconductor elements 210, 220, 230, and 240 are stacked and connected, for example, the semiconductor element 220 of the second layer is mounted over the semiconductor element 210 such that the protruding electrodes 211 of the semiconductor element 210 of the first layer are fitted in the through-holes 223. At this moment, the protruding electrodes 221 on the lower face of the semiconductor element 220 are fitted into the recesses 212 of the semiconductor element 210. The semiconductor elements 210 and 220 are formed such that the protruding electrodes 211 do not protrude from the through-holes 223 when the semiconductor element 220 is mounted over the semiconductor element 210.

Next, the semiconductor element 230 of the third layer is mounted over the semiconductor element 220 such that the protruding electrodes 221 on the upper face of the semiconductor element 220 of the second layer are fitted in the through-holes 233. At this moment, some of the protruding electrodes 231 of the semiconductor element 230 are fitted into the through-holes 223 of the semiconductor element 220 where the protruding electrodes 211 are fitted, and the remaining protruding electrodes 231 are fitted into the recesses 222 of the semiconductor element 220. The semiconductor elements 220 and 230 are formed such that the protruding electrodes 221 do not protrude from the through-holes 233 when the semiconductor element 230 is mounted over the semiconductor element 220.

Next, the semiconductor element 240 of the fourth layer is mounted over the semiconductor element 230 of the third layer. At this moment, some of the protruding electrodes 241 of the semiconductor element 240 are fitted into the through-holes 233 of the semiconductor element 230 where the protruding electrodes 221 are fitted, and the remaining protruding electrodes 241 are fitted into the recesses 232 of the semiconductor element 230.

After the semiconductor elements 210, 220, 230, and 240 are stacked in this manner, the solder portions are reflowed. With this, the protruding electrodes 211 and 231 are connected together inside the through-holes 223, and the protruding electrodes 221 and 241 are connected together inside the through-holes 233 as illustrated in FIG. 17B. That is, the post portions 211a and 231a are connected together by connecting portions 251 into which the solder portions 211b and 231b are integrated, and the post portions 221a and 241a are connected together by connecting portions 252 into which the solder portions 221b and 241b are integrated. During the reflow soldering, the protruding electrodes 221 are connected to the electrodes 212a on the recesses 212, the protruding electrodes 231 are connected to the electrodes 222a on the recesses 222, and the protruding electrodes 241 are connected to the electrodes 232a on the recess 232 as illustrated in FIG. 17B.

In this manner, the semiconductor elements 210, 220, 230, and 240 are connected together, resulting in the semiconductor device 200 as illustrated in FIG. 17B.

The sidewalls of the through-holes 223 of the semiconductor element 220 and those of the through-holes 233 of the semiconductor element 230 may be covered with insulating films. Spaces between the semiconductor elements 210 and 220, between the semiconductor elements 220 and 230, and between the semiconductor elements 230 and 240 may be filled with resin such as underfill.

Although the semiconductor device 200 described above includes the laminate of the four semiconductor elements 210, 220, 230, and 240 connected together, semiconductor devices including five or more semiconductor elements may be formed in accordance with the above-described example.

The connection of the different semiconductor elements inside the through-holes or the recesses reduces the risks of the above-described displacement and short circuits, thereby leading to a semiconductor device 200 with high connection reliability. Furthermore, the connection of the protruding electrodes after the protruding electrodes are fitted in the through-holes and the recesses reduces the risk of the displacement of the protruding electrodes, and allows three or more semiconductor elements to be connected at the same time in one-time reflow soldering. That is, if the semiconductor elements do not have the through-holes or the recesses, for example, reflow soldering is needed each time the semiconductor elements are stacked and connected, and displacement between the semiconductor elements may occur on all such occasions. In contrast, when the semiconductor elements have the through-holes and the recesses as described above, the semiconductor device is efficiently formed by one-time reflow soldering while the risk of the displacement of the semiconductor elements is reduced.

Although the laminate only includes the semiconductor elements in the description above, the laminate may include electronic elements such as circuit boards. Even when any of the semiconductor elements 210, 220, and 230 among the four semiconductor elements 210, 220, 230, and 240 is replaced with a circuit board, an electronic device including the laminate produces effects similar to those described above.

Figure 18:
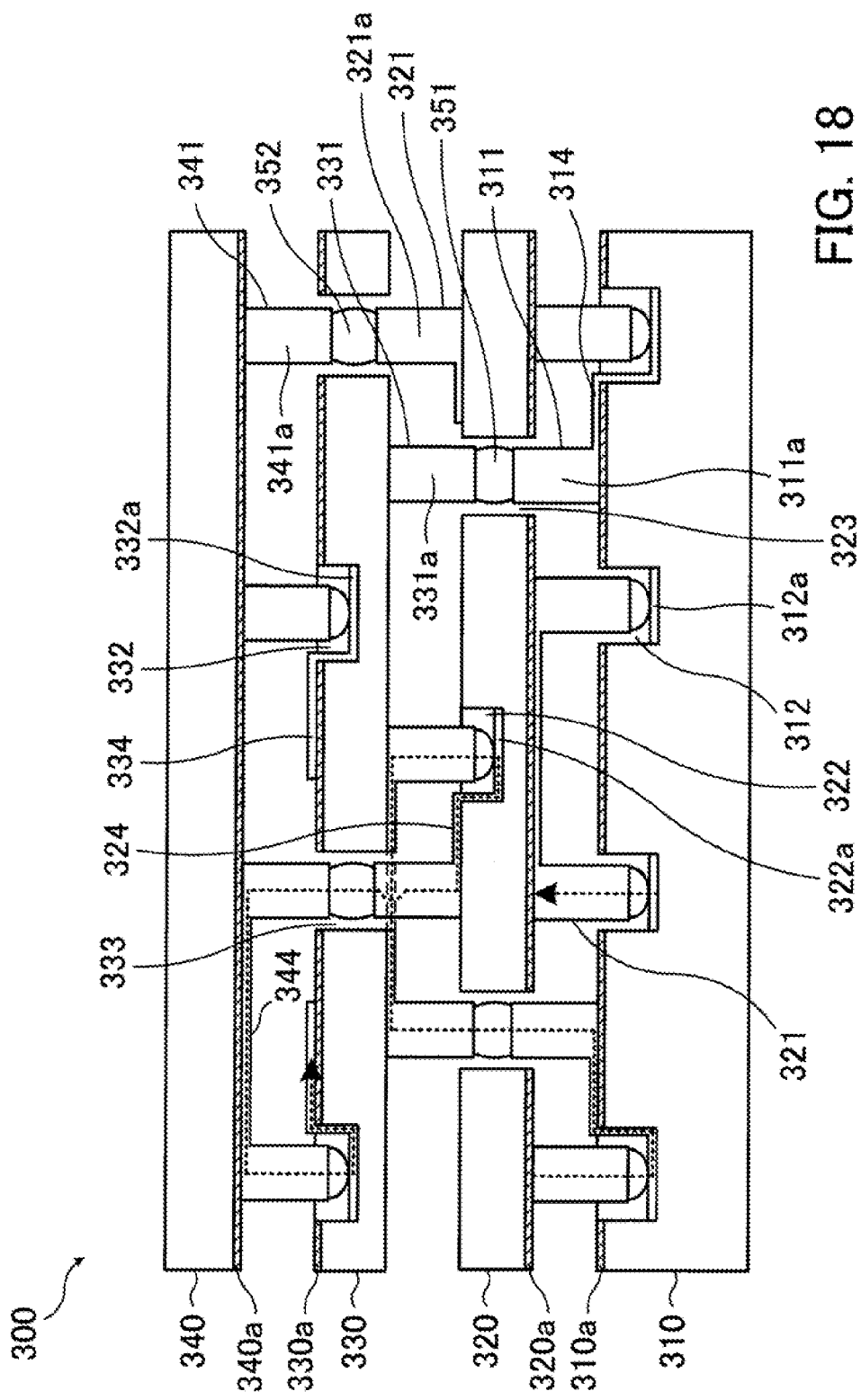
FIG. 18 illustrates an example structure of a semiconductor device according to the fourth embodiment.

FIG. 18 illustrates an example structure of a semiconductor device according to the fourth embodiment. FIG. 18 is a schematic cross-section of a principal part of an example semiconductor device according to the fourth embodiment.

A semiconductor device 300 illustrated in FIG. 18 includes a laminate of four semiconductor elements 310, 320, 330, and 340 connected together.

The semiconductor element 310 of the first layer and the semiconductor element 320 of the second layer are disposed such that the upper face of the semiconductor element 310 having regions (circuit regions) 310a and the lower face of the semiconductor element 320 having circuit regions 320a oppose each other. The circuit regions include elements such as transistors and wiring layers formed therein. The semiconductor element 330 of the third layer and the semiconductor element 340 of the fourth layer are disposed such that the upper face of the semiconductor element 330 having circuit regions 330a and the lower face of the semiconductor element 340 having circuit regions 340a oppose each other.

The semiconductor element 310 of the first layer has protruding electrodes 311, recesses 312, and electrodes 312a formed on the upper face having the circuit regions 310a. The protruding electrodes 311 are connected to rewiring lines 314 (some of which are connected to the electrodes 312a).

The semiconductor element 320 of the second layer has protruding electrodes 321 formed on both upper and lower faces thereof and recesses 322 and electrodes 322a formed on the upper face on which the circuit regions 320a are not formed. The protruding electrodes 321 are connected to rewiring lines 324 (some of which are connected to the electrode 322a). Furthermore, the semiconductor element 320 has through-holes 323.

The semiconductor element 330 of the third layer has protruding electrodes 331 formed on the lower face on which the circuit regions 330a are not formed and recesses 332 and electrodes 332a formed on the upper face having the circuit region 330a. The protruding electrode 331 and the electrodes 332a are connected to rewiring lines 334. Furthermore, the semiconductor element 330 has through-holes 333.

The semiconductor element 340 of the fourth layer has protruding electrodes 341 formed on the lower face having the circuit regions 340a. The protruding electrodes 341 are connected to rewiring lines 344.

The protruding electrodes 311 and 331 that oppose each other between the semiconductor element 310 of the first layer and the semiconductor element 330 of the third layer are fitted into the through-holes 323 of the semiconductor element 320 of the second layer, and are connected together inside the through-holes 323. That is, post portions 311a and 331a are connected by connecting portions 351 inside the through-holes 323.

The protruding electrodes 321 and 341 that oppose each other between the semiconductor element 320 of the second layer and the semiconductor element 340 of the fourth layer are fitted into the through-holes 333 of the semiconductor element 330 of the third layer, and are connected together inside the through-holes 333. That is, post portions 321a and 341a are connected by connecting portions 352 inside the through-holes 333.

The protruding electrodes 321 on the lower face of the semiconductor element 320 of the second layer having the circuit regions 320a are fitted into the recesses 312 of the semiconductor element 310 of the first layer, and are connected to the electrodes 312a. That is, the post portions 321a are connected to the electrodes 312a via solder portions.

Some of the protruding electrodes 331 of the semiconductor element 330 of the third layer are fitted into the recesses 322 of the semiconductor element 320 of the second layer, and are connected to the electrodes 322a. That is, the post portions 331a are connected to the electrode 322a via solder portions.

Some of the protruding electrodes 341 of the semiconductor element 340 of the fourth layer are fitted into the recesses 332 of the semiconductor element 330 of the third layer, and are connected to the electrodes 332a. That is, the post portions 341a are connected to the electrodes 332a via solder portions.

The four semiconductor elements 310, 320, 330, and 340 may be connected together at the same time in one-time reflow soldering.

An example of a signal propagation route in the semiconductor device 300 having the above-described structure is indicated by dotted arrows in FIG. 18. In the semiconductor device 300, the four semiconductor elements 310, 320, 330, and 340 connected as above cooperate with each other to implement predetermined processing functions.

In the semiconductor device 300 formed as above, the through-holes 323 and 333 and recesses 312, 322, and 332 are able to reduce the risks of the displacement and the short circuits of the semiconductor elements 310, 320, 330, and 340. In addition, the semiconductor device 300 is efficiently formed with one-time reflow soldering.

Subsequently, example methods of forming semiconductor elements having only through-holes or having both through-holes and recesses will be described.

First, an example method of forming a semiconductor element having through-holes will be described in sequence with reference to FIGS. 19A to 21C. FIGS. 19A to 21C are schematic cross-sections of a principal part in each forming step.

Figure 19A:
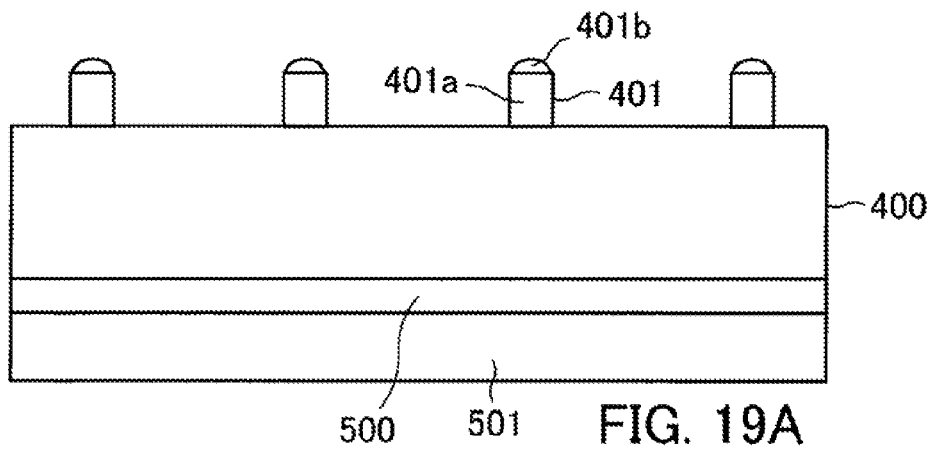
FIGS. 19A to 19C illustrate a first forming process of an example semiconductor element having through-holes.
Figure 19B:
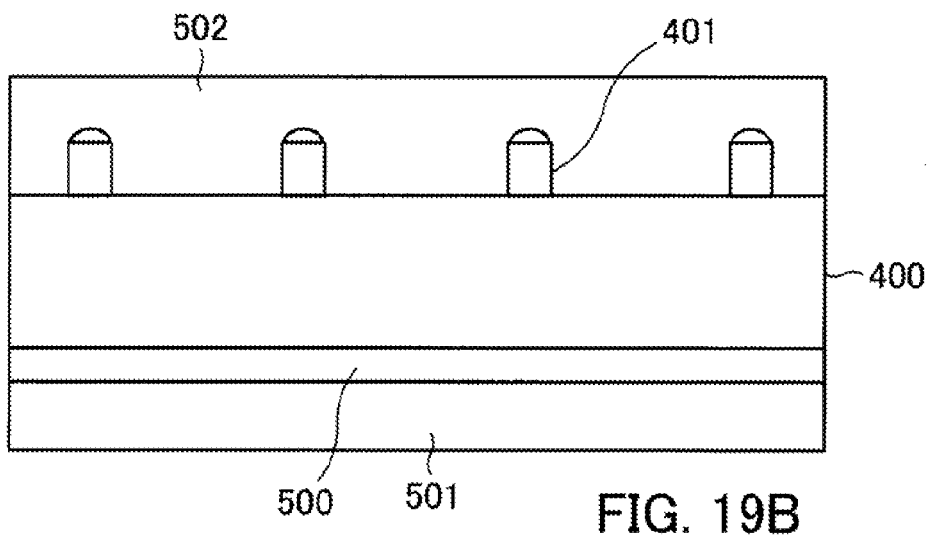
Figure 19C:
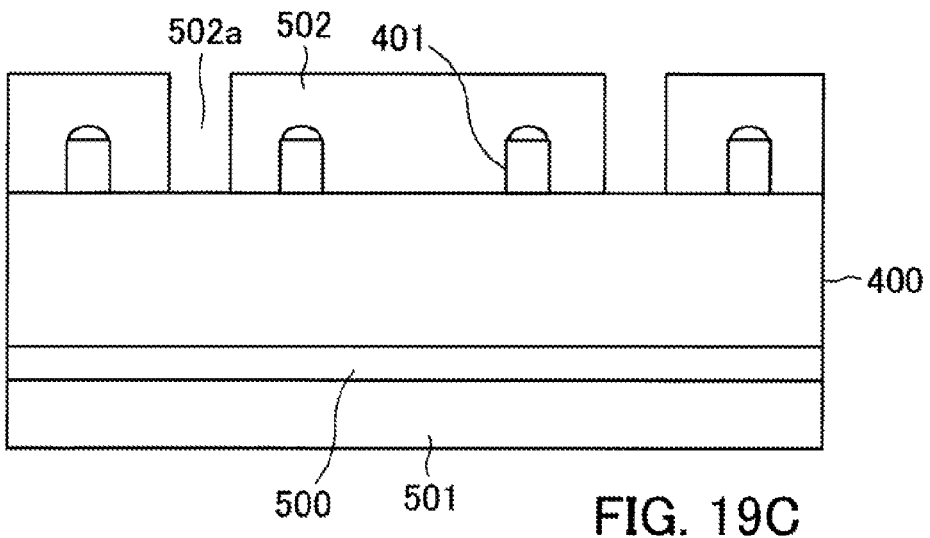

FIGS. 19A to 19C illustrate a first forming process of an example semiconductor element having through-holes.

As illustrated in FIG. 19A, a supporting substrate 501 is affixed to the rear face of a semiconductor element 400 using adhesive 500. Herein, protruding electrodes 401 each including a post portion 401a and a solder portion 401b formed at the end of the post portion 401a are formed on the front face, which is opposite to the rear face, of the semiconductor element 400. The semiconductor element 400 is an active element, and the protruding electrodes 401 are formed on the front face having circuit regions (regions in which elements such as transistors and wiring layers are formed). Next, a resist 502 is formed on the front face of the semiconductor element 400 as illustrated in FIG. 19B. Subsequently, openings 502a are formed in the resist 502 using a photolithographic technique at regions where through-holes are to be formed as illustrated in FIG. 19C.

Figure 20A:
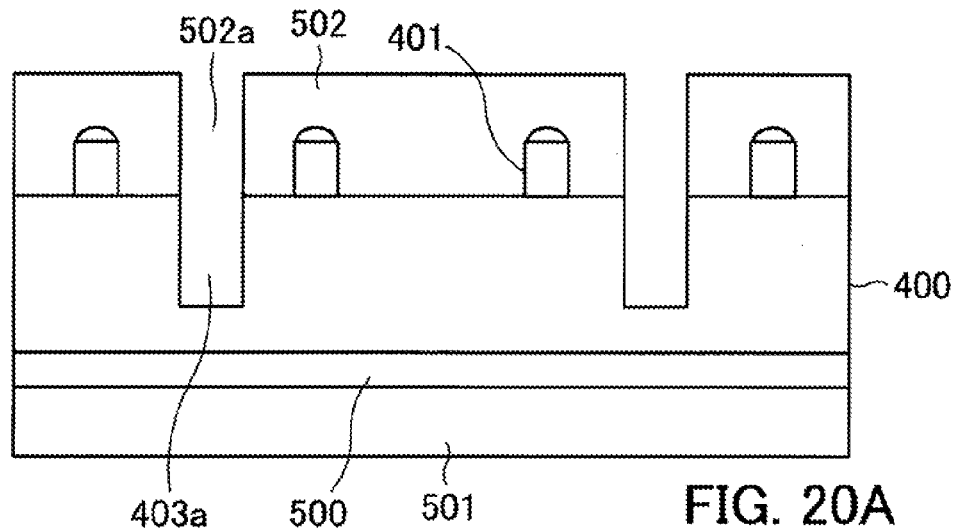
FIGS. 20A to 20C illustrate a second forming process of the example semiconductor element having the through-holes.
Figure 20B:
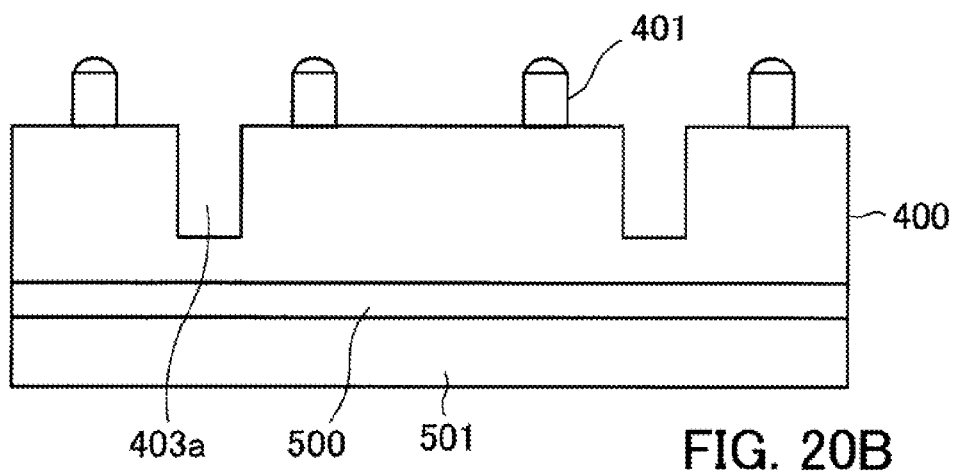
Figure 20C:
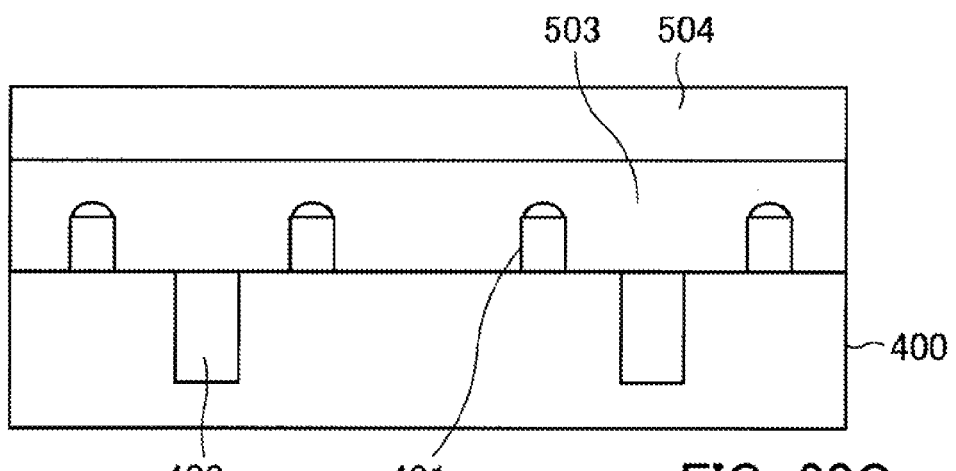

FIGS. 20A to 20C illustrate a second forming process of the example semiconductor element having the through-holes.

After the openings 502a are formed in the resist 502, holes 403a are formed in the semiconductor element 400 by dry etching using the resist 502 as a mask as illustrated in FIG. 20A. Subsequently, the resist 502 is removed from the semiconductor element 400 as illustrated in FIG. 20B, and a supporting substrate 504 is affixed to the front face of the semiconductor element 400 using adhesive 503 as illustrated in FIG. 20C.

Figure 21A:
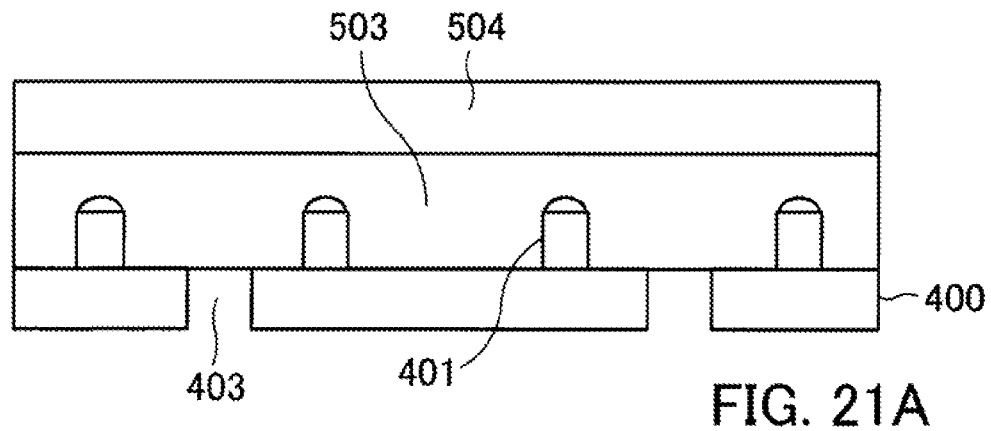
FIGS. 21A to 21C illustrate a third forming process of the example semiconductor element having the through-holes.
Figure 21B:
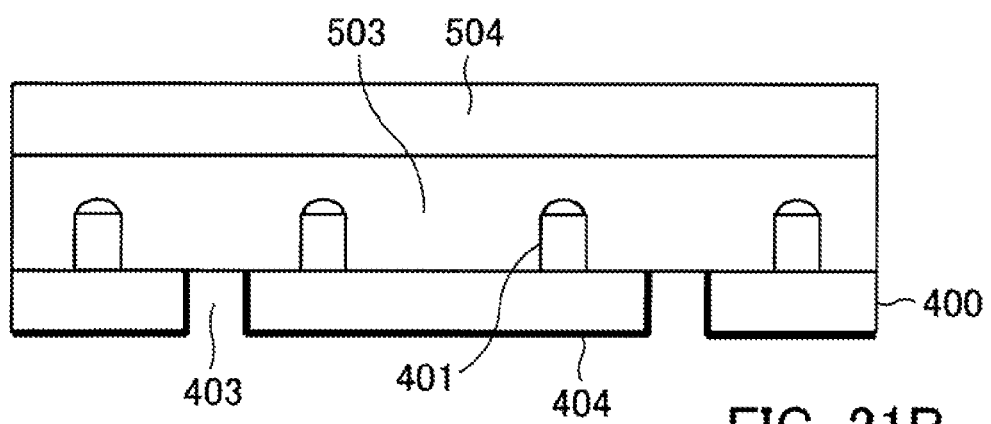
Figure 21C:
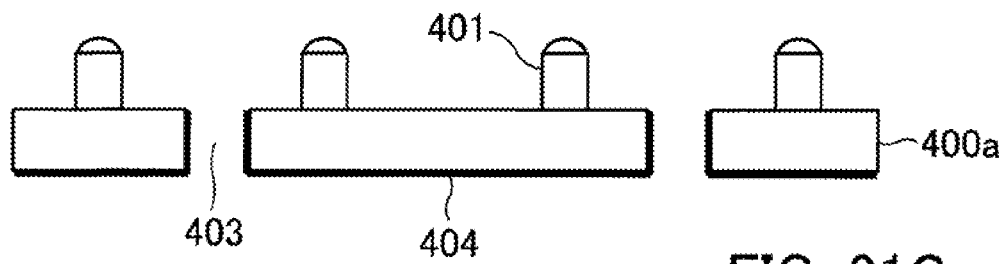

FIGS. 21A to 21C illustrate a third forming process of the example semiconductor element having the through-holes.

After the supporting substrate 504 is affixed, back grinding is performed such that the semiconductor element 400 is reduced to a predetermined thickness as illustrated in FIG. 21A. At this moment, the holes 403a that have been formed in the front face of the semiconductor element 400 in advance appear in the rear face, resulting in through-holes 403 formed in the semiconductor element 400. After the back grinding, insulating films 404 composed of, for example, silicon dioxide ($SiO_2$) are formed as illustrated in FIG. 21B. The insulating films 404 may be formed by, for example, thermal oxidation or chemical vapor deposition (CVT). After the formation of the insulating films 404, the adhesive 503 and the supporting substrate 504 are removed. This completes the formation of a semiconductor element 400a as illustrated in FIG. 21C. Protruding electrodes of other electronic elements are fitted into the through-holes 403 of the semiconductor element 400a.

Although the above-described semiconductor element 400a (400) is an active element, a semiconductor element of a dummy element may also be formed in a similar manner.

In addition, the method of forming the semiconductor element 400a having the protruding electrodes 401 including the post portions 401a described above may also be used to form through-holes in a semiconductor element that does not have such post electrodes. For example, the semiconductor element 40 (dummy element or active element) disposed between the two semiconductor elements to be connected described in the first and second embodiments may also be formed in accordance with the method as illustrated in FIGS. 19A to 21C.

Next, another example method of forming a semiconductor device having through-holes will be described in sequence with reference to FIGS. 22A to 27C. FIGS. 22A to 27C are schematic cross-sections of a principal part in each forming step.

Figure 22A:
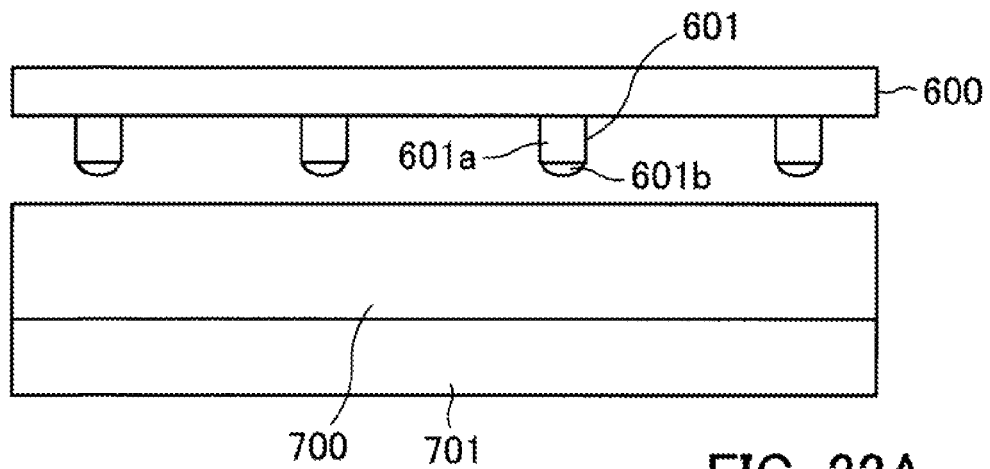
FIGS. 22A to 22C illustrate a first forming process of another example semiconductor element having through-holes.
Figure 22B:
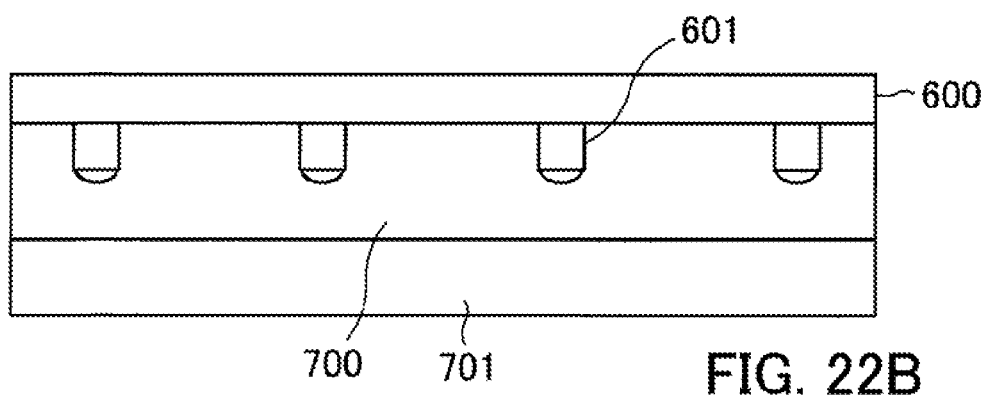
Figure 22C:
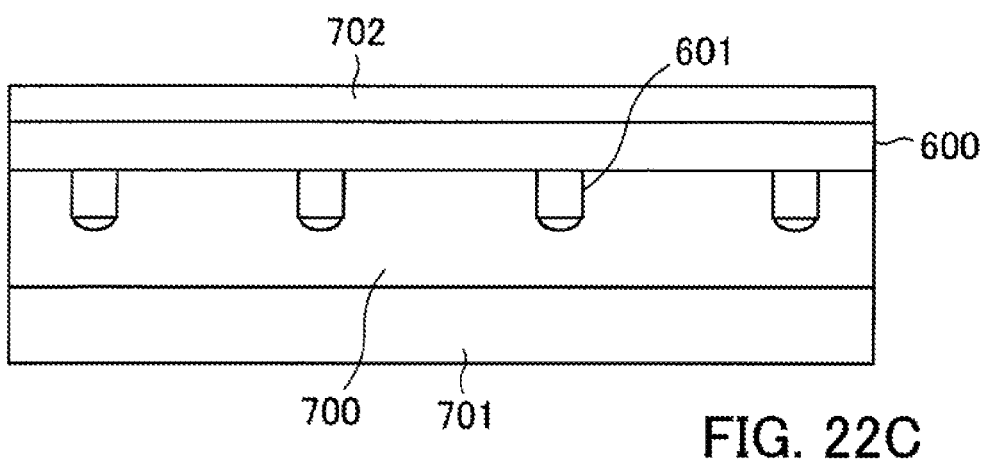

FIGS. 22A to 22C illustrate a first forming process of another example semiconductor element having through-holes.

As illustrated in FIGS. 22A and 22B, a supporting substrate 701 is affixed to the front face, on which the protruding electrodes 601 are formed, of a semiconductor element 600 using adhesive 700. Herein, the protruding electrodes 601 each include a post portion 601a and a solder portion 601b formed at the end of the post portion 601a. The semiconductor element 600 is an active element having the protruding electrodes 601 formed on the face having circuit regions, and is reduced to a predetermined thickness. After the affixation of the supporting substrate 701, a resist 702 is formed on the rear face, which is opposite to the front face on which the protruding electrodes 601 are formed, of the semiconductor element 600 as illustrated in FIG. 22C.

Figure 23A:
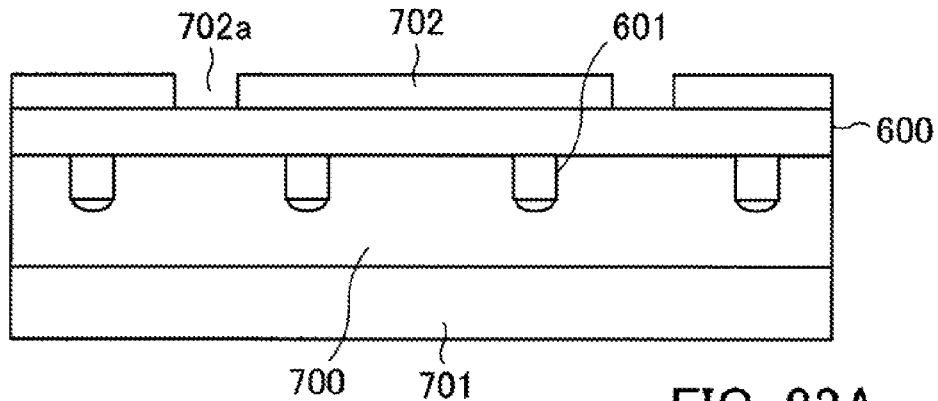
FIGS. 23A to 23C illustrate a second forming process of the other example semiconductor element having the through-holes.
Figure 23B:
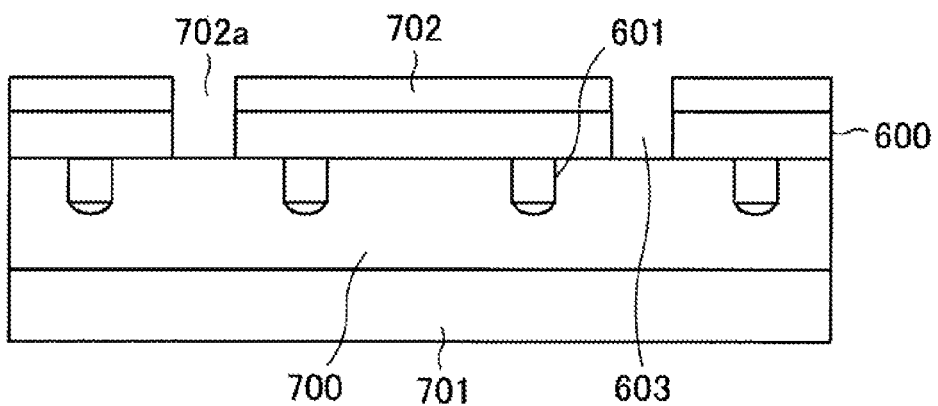
Figure 23C:
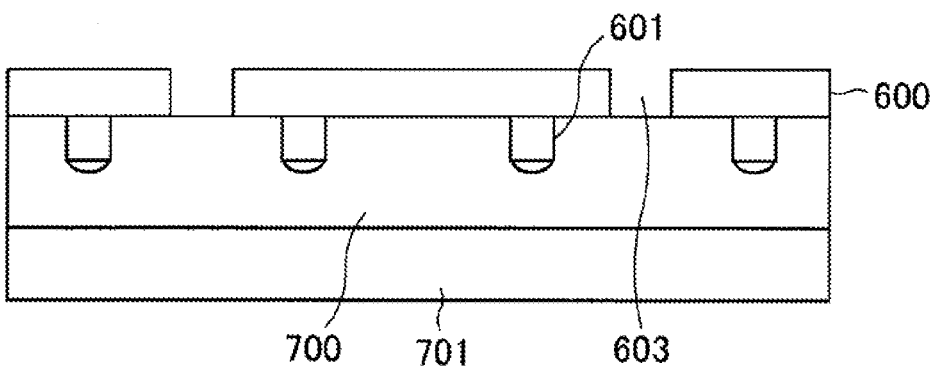

FIGS. 23A to 23C illustrate a second forming process of the other example semiconductor element having the through-holes.

After the formation of the resist 702, openings 702a are formed in the resist 702 using a photolithographic technique at regions where through-holes are to be formed as illustrated in FIG. 23A. After the formation of the openings 702a, through-holes 603 are formed in the semiconductor element 600 by dry etching using the resist 702 as a mask as illustrated in FIG. 23B. After the formation of the through-holes 603, the resist 702 is removed from the semiconductor element 600 as illustrated in FIG. 23C.

Figure 24A:
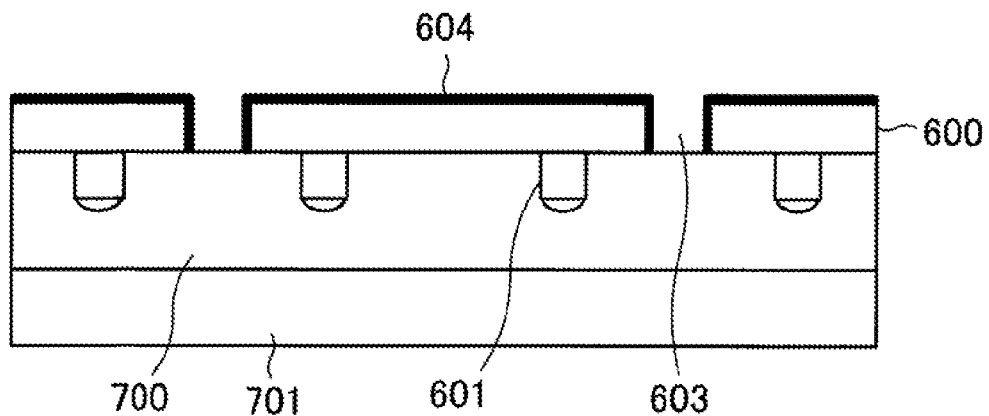
FIGS. 24A to 24C illustrate a third forming process of the other example semiconductor element having the through-holes.
Figure 24B:
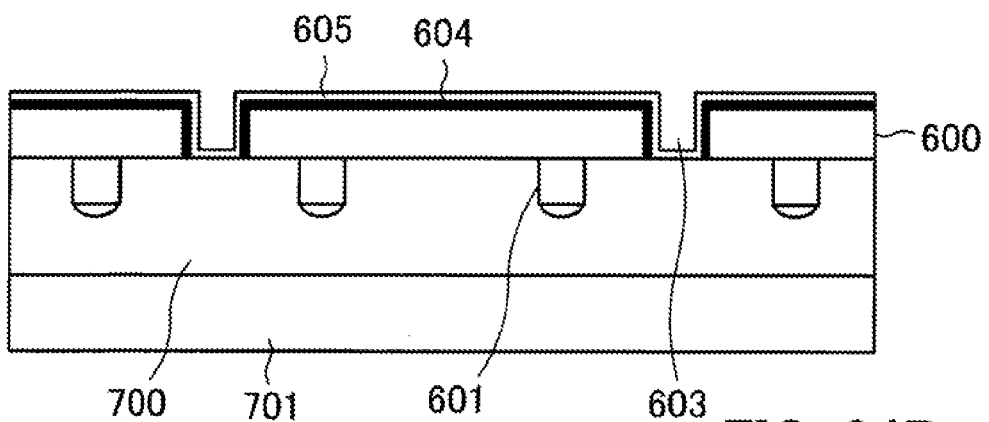
Figure 24C:
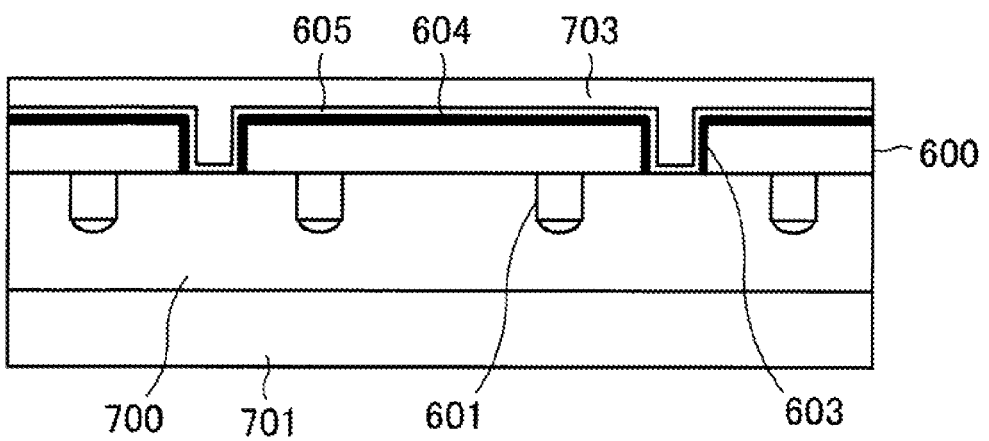

FIGS. 24A to 24C illustrate a third forming process of the other example semiconductor element having the through-holes.

After the removal of the resist 702, insulating films 604 composed of, for example, $SiO_2$ are formed by, for example, thermal oxidation or CVD as illustrated in FIG. 24A. After the formation of the insulating films 604, a seed layer 605 is formed as illustrated in FIG. 24B, and a resist 703 is formed as illustrated in FIG. 24C.

Figure 25A:
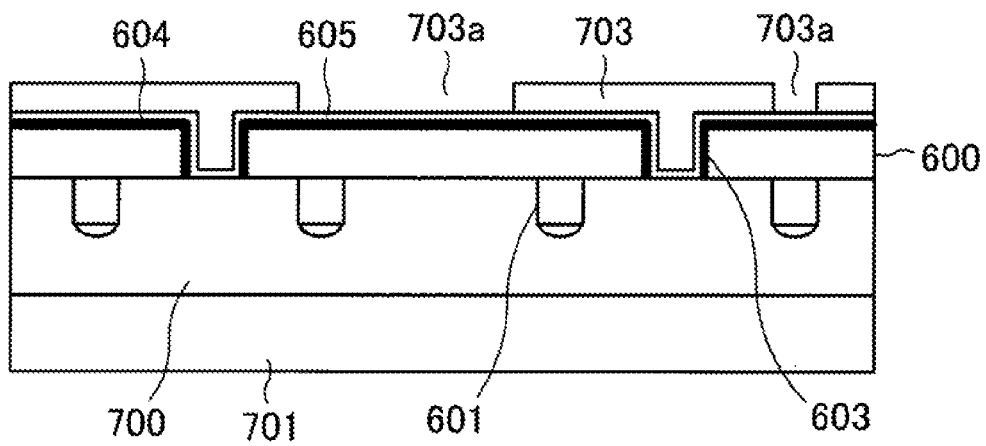
FIGS. 25A to 25C illustrate a fourth forming process of the other example semiconductor element having the through-holes.
Figure 25B:
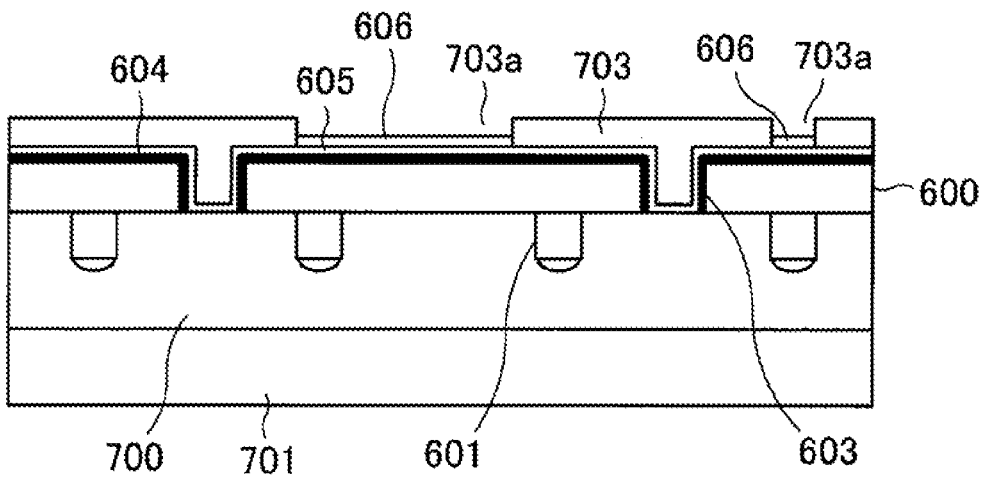
Figure 25C:
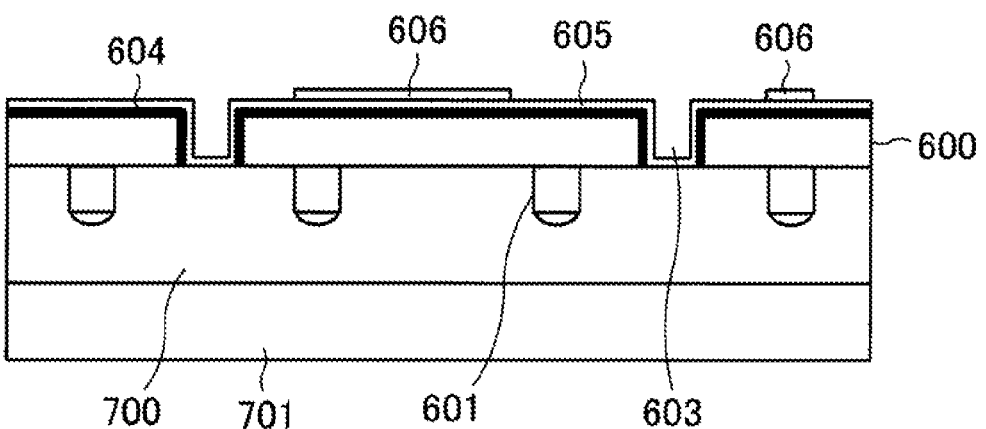

FIGS. 25A to 25C illustrate a fourth forming process of the other example semiconductor element having the through-holes.

After the formation of the resist 703, openings 703a are formed in regions in which rewiring lines are to be formed as illustrated in FIG. 25A. Subsequently, rewiring lines 606 are formed on the seed layer 605 in the openings 703a by plating as illustrated in FIG. 25B. After the formation of the rewiring lines 606, the resist 703 is removed as illustrated in FIG. 25C.

Figure 26A:
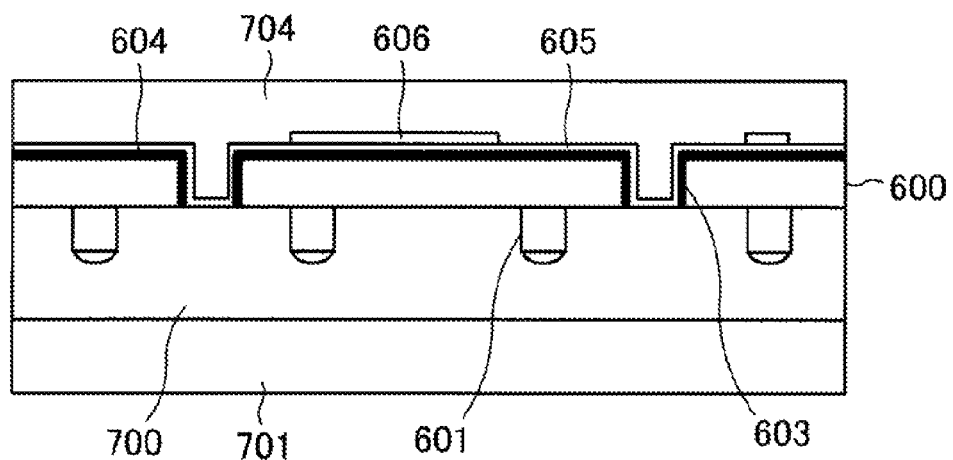
FIGS. 26A to 26C illustrate a fifth forming process of the other example semiconductor element having the through-holes.
Figure 26B:
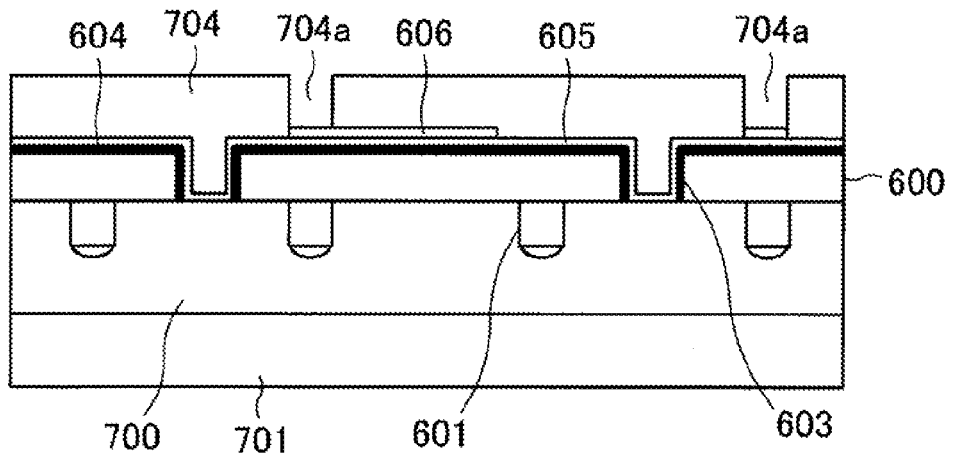
Figure 26C:
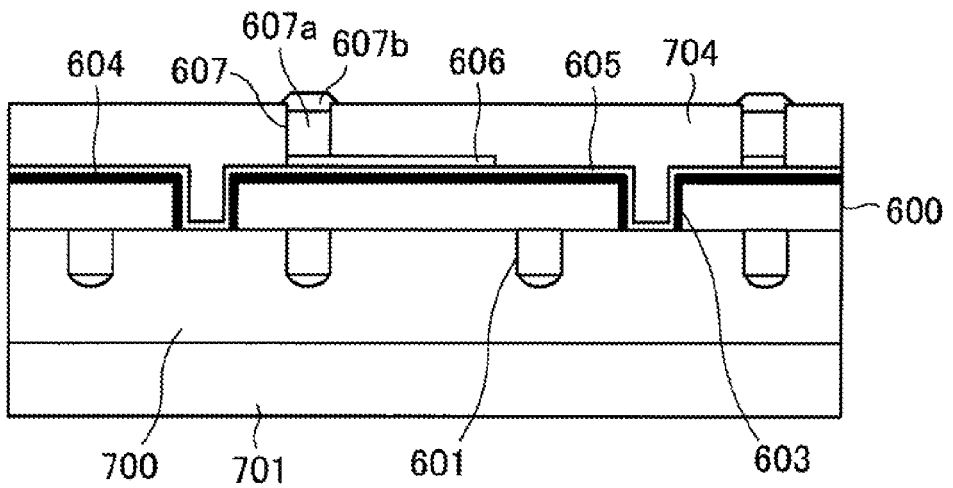

FIGS. 26A to 26C illustrate a fifth forming process of the other example semiconductor element having the through-holes.

After the removal of the resist 703, another resist 704 is formed as illustrated in FIG. 26A, and openings 704a are formed in regions in which protruding electrodes are to be formed as illustrated in FIG. 26B. Subsequently, post portions 607a are formed on the rewiring lines 606 in the openings 704a by plating, and furthermore, solder portions 607b are formed on the post portions 607a so that protruding electrodes 607 are formed as illustrated in FIG. 26C. The height of the protruding electrodes 607 may be adjusted by controlling, for example, the thickness of the resist 704 and conditions of plating (plating time, current density, and other parameters).

Figure 27A:
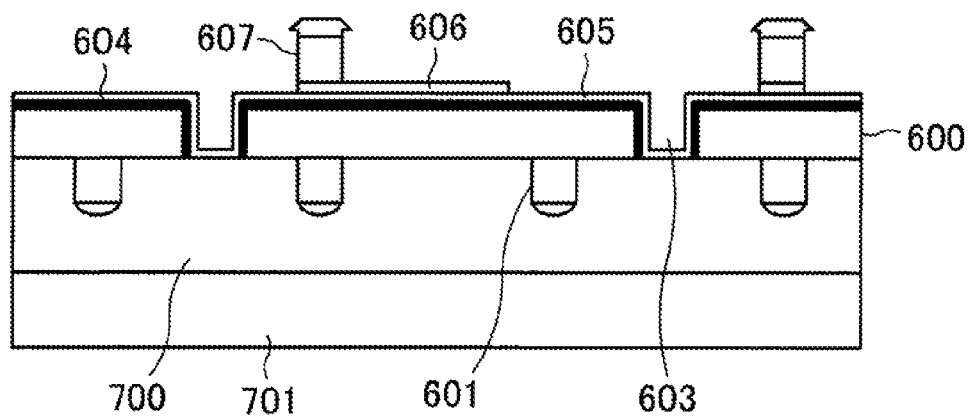
FIGS. 27A to 27C illustrate a sixth forming process of the other example semiconductor element having the through-holes.
Figure 27B:
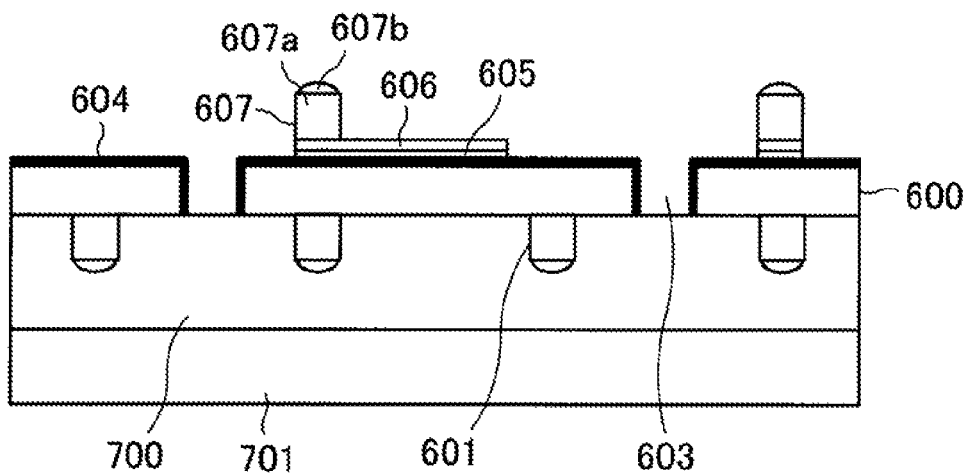
Figure 27C:
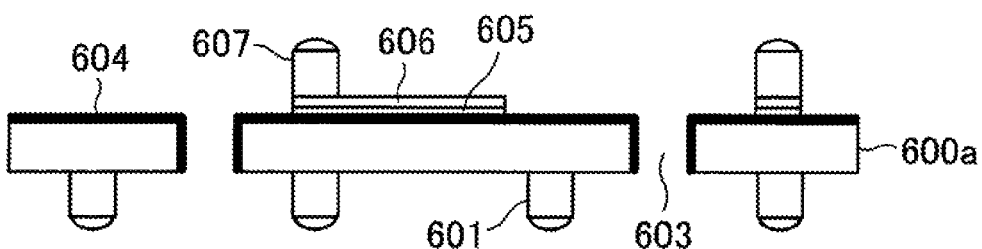

FIGS. 27A to 27C illustrate a sixth forming process of the other example semiconductor element having the through-holes.

After the formation of the protruding electrodes 607, the resist 704 is removed as illustrated in FIG. 27A. Subsequently, portions of the seed layer 605 that appear after the removal of the resist 704 are removed by etching as illustrated in FIG. 27B. After the etching, the solder portions 607b are shaped by reflowing, and the adhesive 700 and the supporting substrate 701 are removed. This completes the formation of a semiconductor element 600a as illustrated in FIG. 27C. Protruding electrodes of other electronic elements are fitted into the through-holes 603 of the semiconductor element 600a.

Although the above-described semiconductor element 600a (600) is an active element, a semiconductor element of a dummy element may also be formed in a similar manner.

In addition, the method of forming the semiconductor element 600a having the protruding electrodes 601 on the front face and the protruding electrodes 607 on the rear face described above may also be used to form a semiconductor element that only has protruding electrodes 607 on the rear face in accordance with the example as illustrated in FIGS. 22A to 27C. That is, the method as illustrated in FIGS. 22A to 27C may be carried out using the semiconductor element 600 without the protruding electrodes 601.

Next, a method of forming an example semiconductor element having through-holes and recesses will be described.

The method may be carried out in a manner similar to that illustrated in FIGS. 22A to 22C and FIGS. 23A to 23C until the through-holes are formed. Herein, an example of subsequent steps will be described in sequence with reference to FIG. 28A to 32C. FIGS. 28A to 32C are schematic cross-sections of a principal part in each forming step.

Figure 28A:
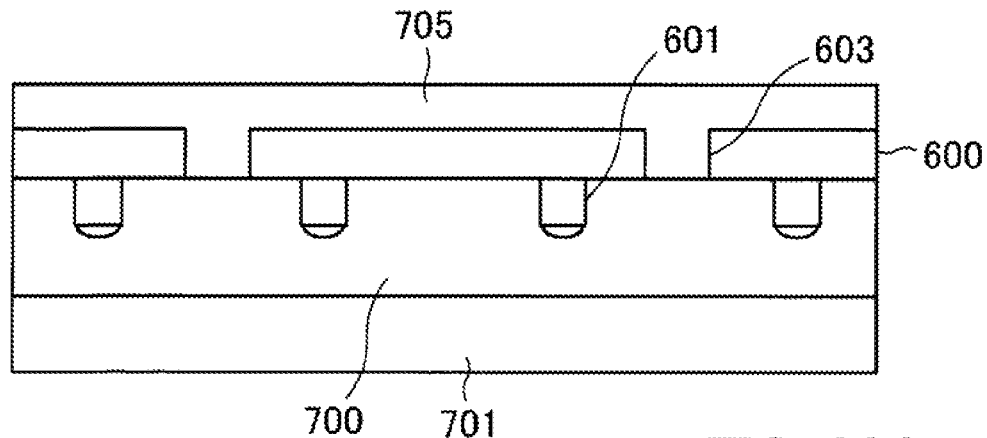
FIGS. 28A to 28C illustrate a first forming process of an example semiconductor element having through-holes and recesses.
Figure 28B:
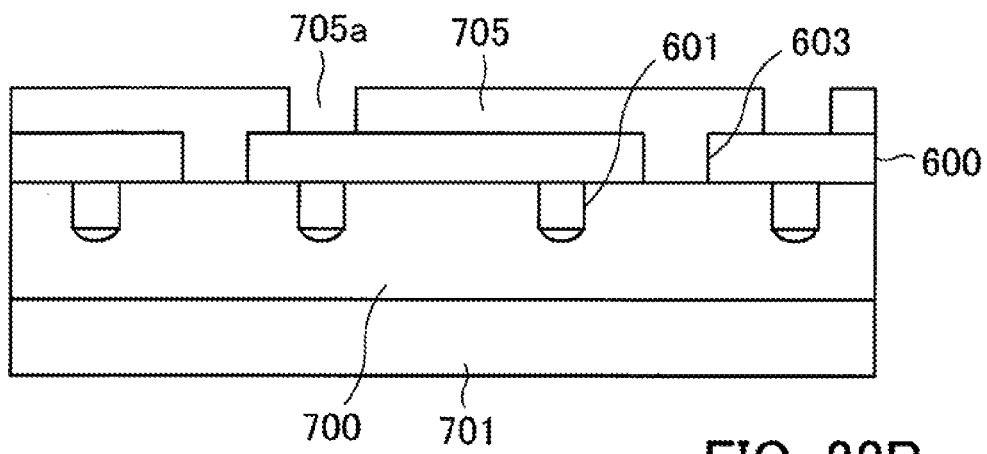
Figure 28C:
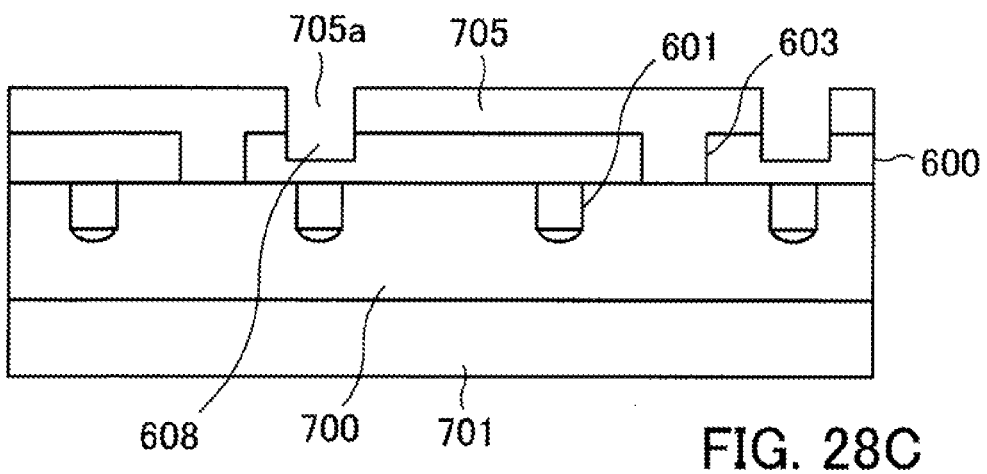

FIGS. 28A to 28C illustrate a first forming process of the example semiconductor element having the through-holes and the recesses.

After the through-holes 603 are formed and the resist 702 is removed as illustrated in FIGS. 22A to 22C and FIGS. 23A to 23C, another resist 705 is formed as illustrated in FIG. 28A, and openings 705a are formed in regions in which recesses are to be formed as illustrated in FIG. 28B. After the formation of the openings 705a, recesses 608 are formed in the semiconductor element 600 by dry etching using the resist 705 as a mask as illustrated in FIG. 28C.

Figure 29A:
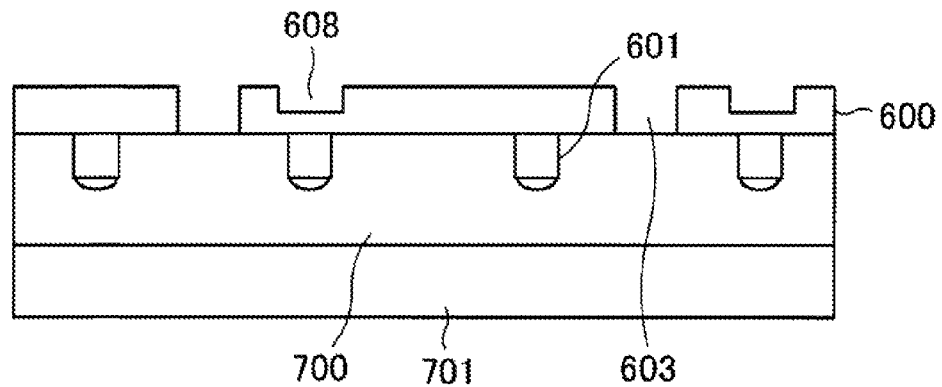
FIGS. 29A and 29C illustrate a second forming process of the example semiconductor element having the through-holes and the recesses.
Figure 29B:
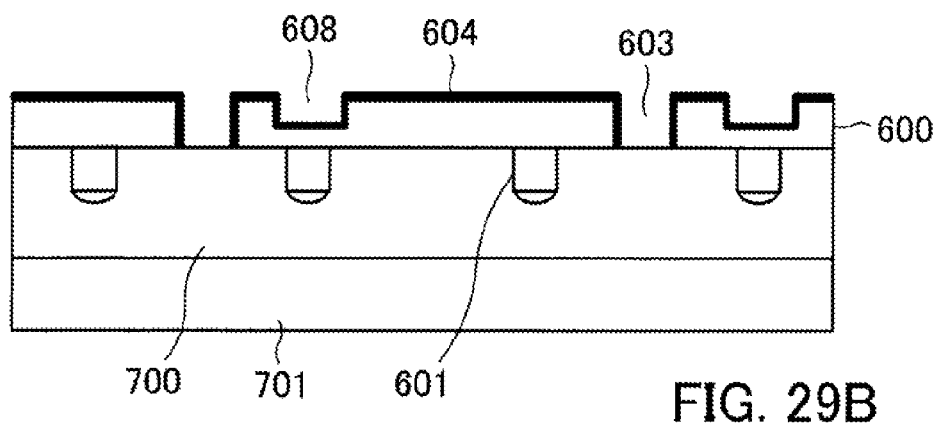
Figure 29C:
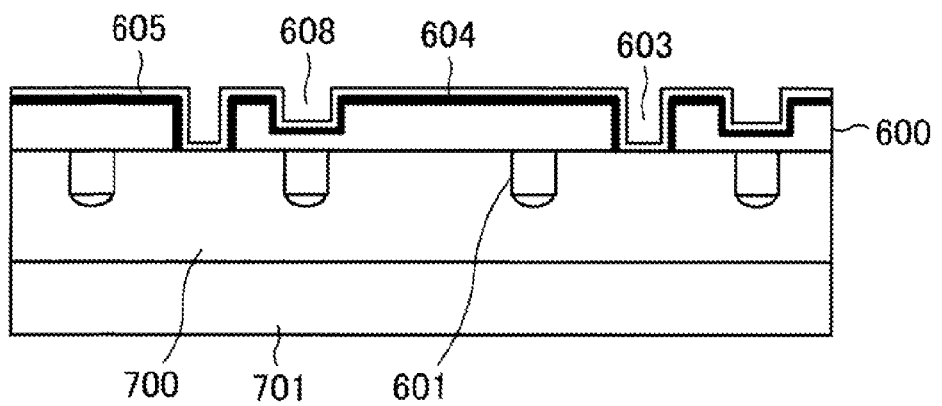

FIGS. 29A to 29C illustrate a second forming process of the example semiconductor element having the through-holes and the recesses.

After the formation of the recesses 608, the resist 705 is removed as illustrated in FIG. 29A, and insulating films 604 are formed by, for example, thermal oxidation or CVD as illustrated in FIG. 29B. After the formation of the insulating films 604, a seed layer 605 is formed as illustrated in FIG. 29C.

Figure 30A:
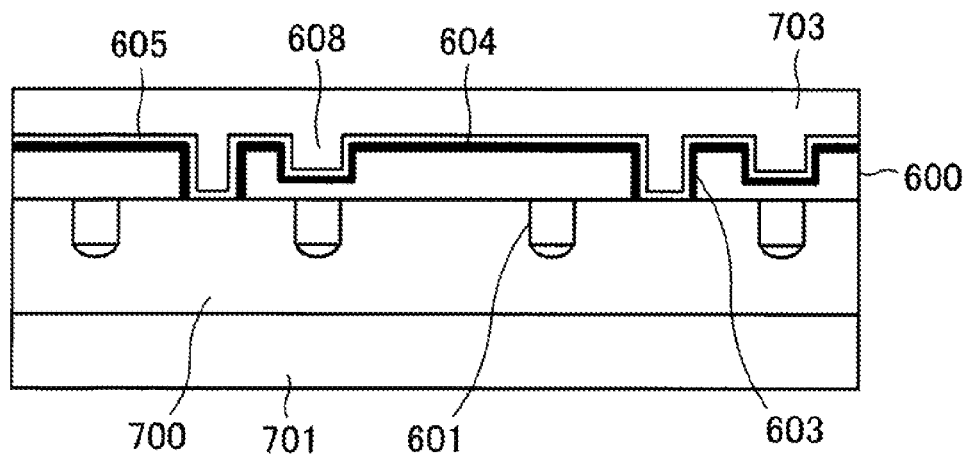
FIGS. 30A to 30C illustrate a third forming process of the example semiconductor element having the through-holes and the recesses.
Figure 30B:
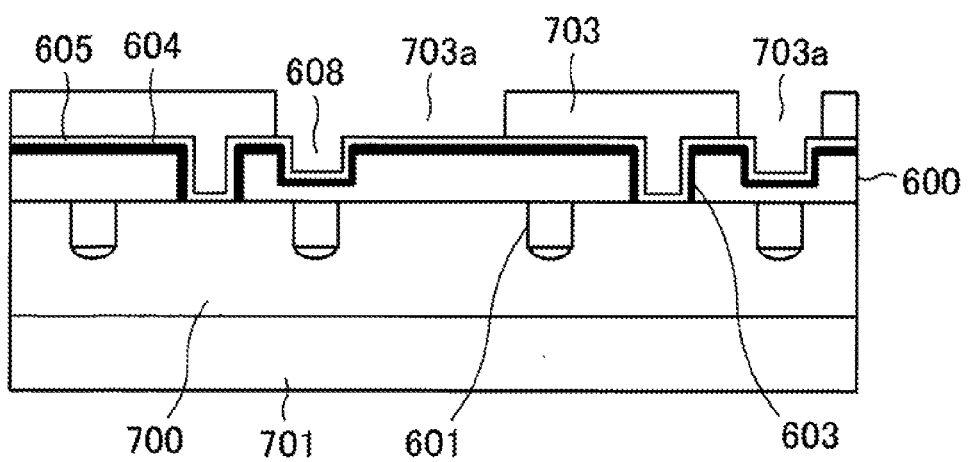
Figure 30C:
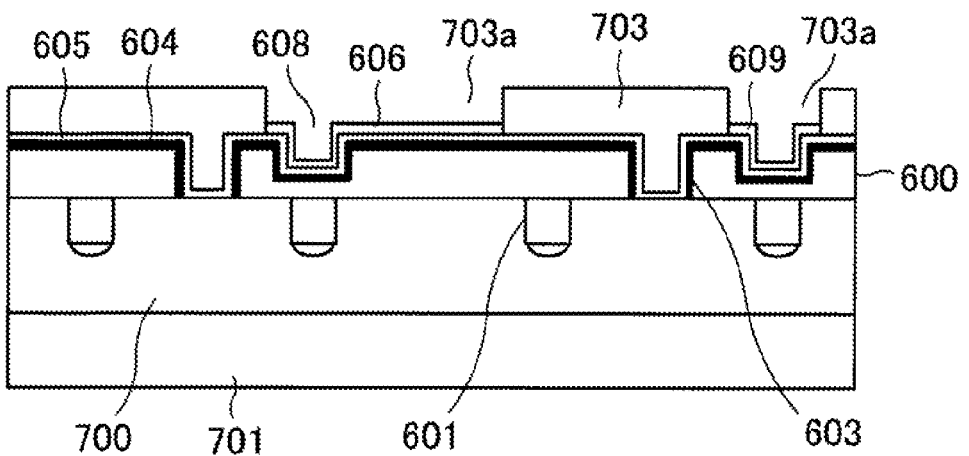

FIGS. 30A to 30C illustrate a third forming process of the example semiconductor element having the through-holes and the recesses.

After the formation of the seed layer 605, a resist 703 is formed as illustrated in FIG. 30A, and openings 703a are formed in regions in which rewiring lines are to be formed and in the recesses 608 as illustrated in FIG. 30B. Subsequently, rewiring lines 606 and electrodes 609 inside the recesses 608 are formed on the seed layer 605 in the openings 703a by plating as illustrated in FIG. 30C. Subsequently, the resist 703 is removed.

Figure 31A:
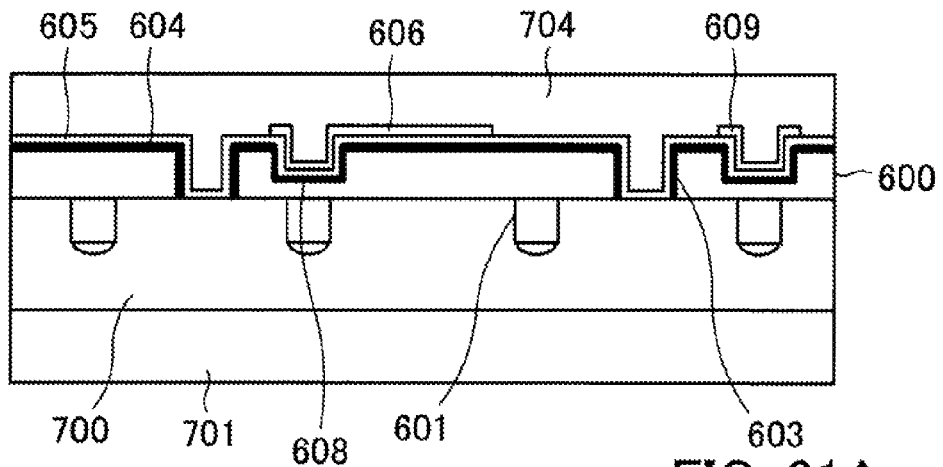
FIGS. 31A to 31C illustrate a fourth forming process of the example semiconductor element having the through-holes and the recesses.
Figure 31B:
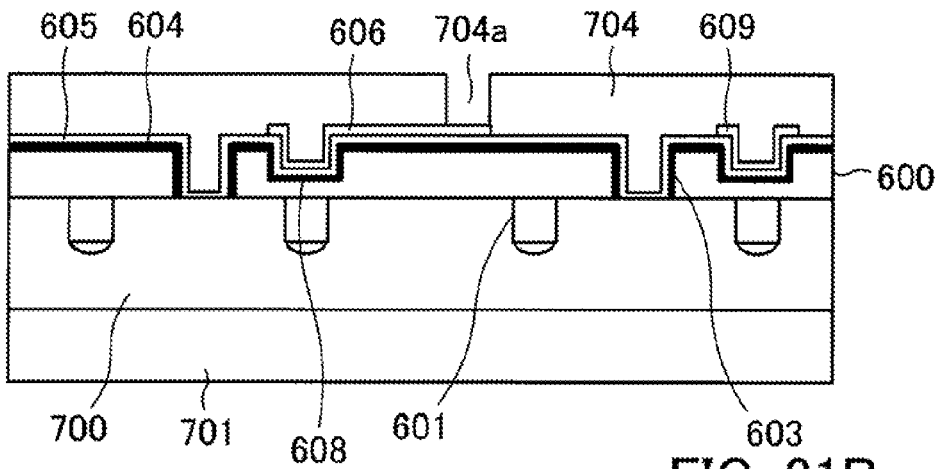
Figure 31C:
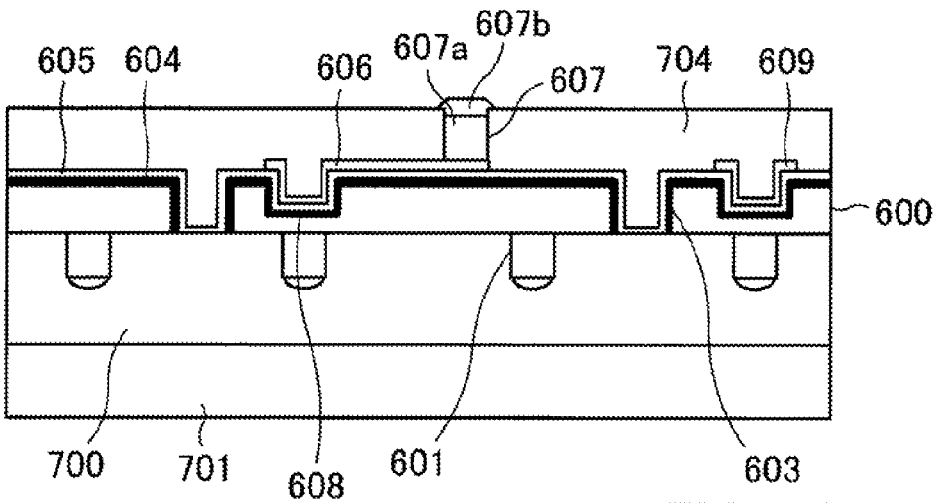

FIGS. 31A to 31C illustrate a fourth forming process of the example semiconductor element having the through-holes and the recesses.

After the formation of the rewiring lines 606 and the electrodes 609, another resist 704 is formed as illustrated in FIG. 31A, and openings 704a are formed in regions in which protruding electrodes are to be formed as illustrated in FIG. 31B. Subsequently, post portions 607a are formed on the rewiring lines 606 in the opening 704a by plating, and furthermore, solder portions 607b are formed on the post portions 607a so that protruding electrodes 607 are formed as illustrated in FIG. 31C.

Figure 32A:
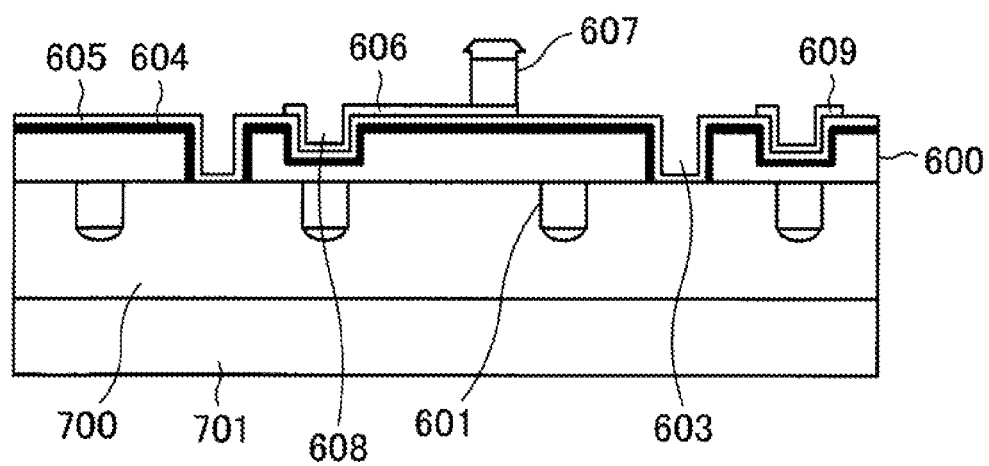
FIGS. 32A to 32C illustrate a fifth forming process of the example semiconductor element having the through-holes and the recesses.
Figure 32B:
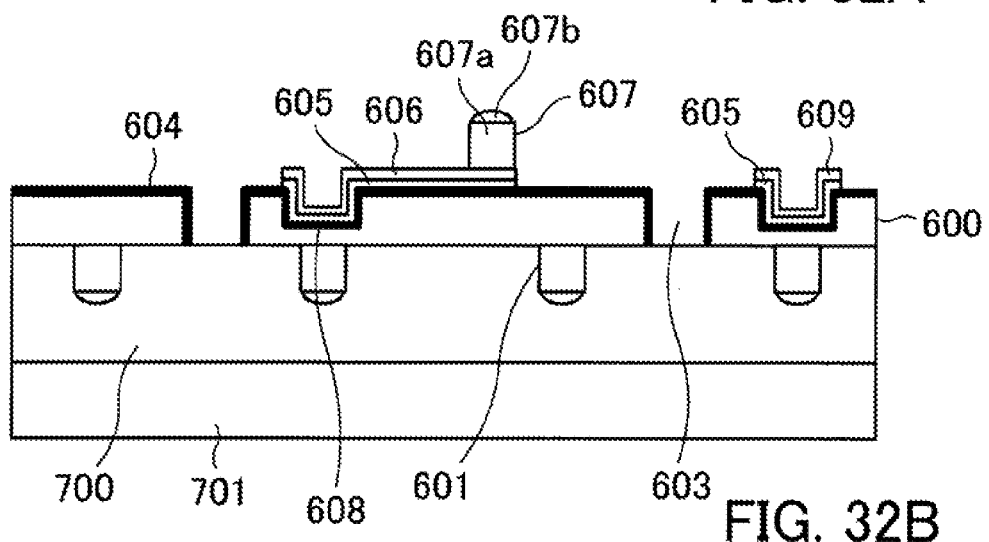
Figure 32C:
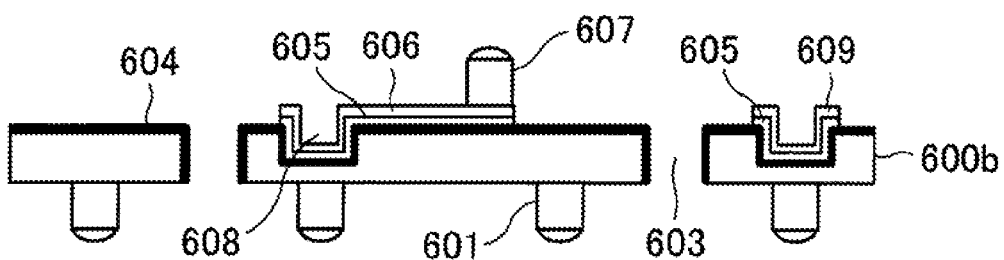

FIGS. 32A to 32C illustrate a fifth forming process of the example semiconductor element having the through-holes and the recesses.

After the formation of the protruding electrodes 607, the resist 704 is removed as illustrated in FIG. 32A. Subsequently, portions of the seed layer 605 that appear after the removal of the resist 704 are removed by etching as illustrated in FIG. 32B. After the etching, the solder portions 607b are shaped by reflowing, and the adhesive 700 and the supporting substrate 701 are removed. This completes the formation of a semiconductor element 600b as illustrated in FIG. 32C. Protruding electrodes of other electronic elements are fitted into the through-holes 603 and the recesses 608 of the semiconductor element 600b.

The semiconductor element 600b (600) may be an active element or a dummy element.

In addition, the method of forming the semiconductor element 600b having the protruding electrodes 601 on the front face and the protruding electrodes 607 on the rear face described above may also be used to form a semiconductor element that only has protruding electrodes 607 on the rear face in accordance with the example as illustrated in FIGS. 28A to 32C.

Although the semiconductor devices including a laminate of a plurality of electronic elements connected together are described above, the forms of the semiconductor devices are not limited to those described above, and may be changed as appropriate.

Figure 33A:
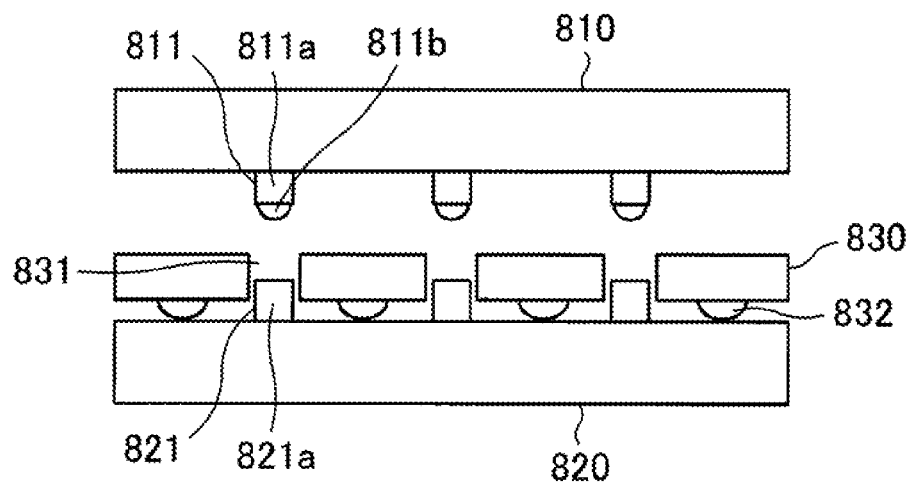
FIGS. 33A and 33B illustrate a first modification.
Figure 33B:
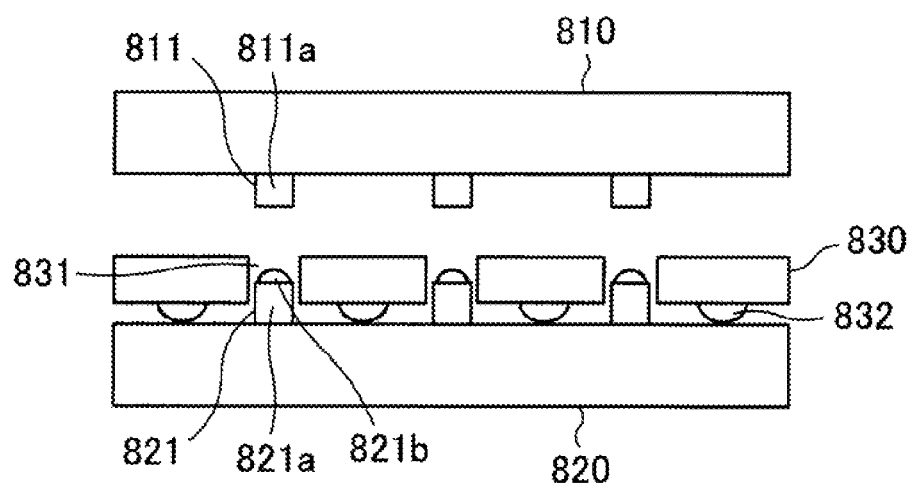

FIGS. 33A and 33B illustrate a first modification. FIGS. 33A and 33B are schematic cross-sections of a principal part of a semiconductor element, an electronic element, and a substrate.

As illustrated in FIGS. 33A and 33B, protruding electrodes 811 of a semiconductor element 810 and opposing protruding electrodes 821 of an electronic element (semiconductor element, circuit board, or the like) 820 to be connected together do not necessarily include solder portions 811b and 821b formed on both protruding electrodes 811 and 821, respectively. For example, as illustrated in FIG. 33A, only the protruding electrodes 811 of the semiconductor element 810 may include post portions 811a and the solder portions 811b formed on the post portions 811a, and the protruding electrodes 821 of the electronic element 820 may include only post portions 821a. Alternatively, as illustrated in FIG. 33B, only the protruding electrodes 821 of the electronic element 820 may include the post portions 821a and the solder portions 821b formed on the post portions 821a, and the protruding electrodes 811 of the semiconductor element 810 may include only the post portions 811a. The protruding electrodes 811 and 821 may be connected together inside through-holes 831 of a substrate (semiconductor element, resin substrate, ceramic substrate, or the like) 830 in either structure illustrated in FIG. 33A or 33B.

Figure 34:
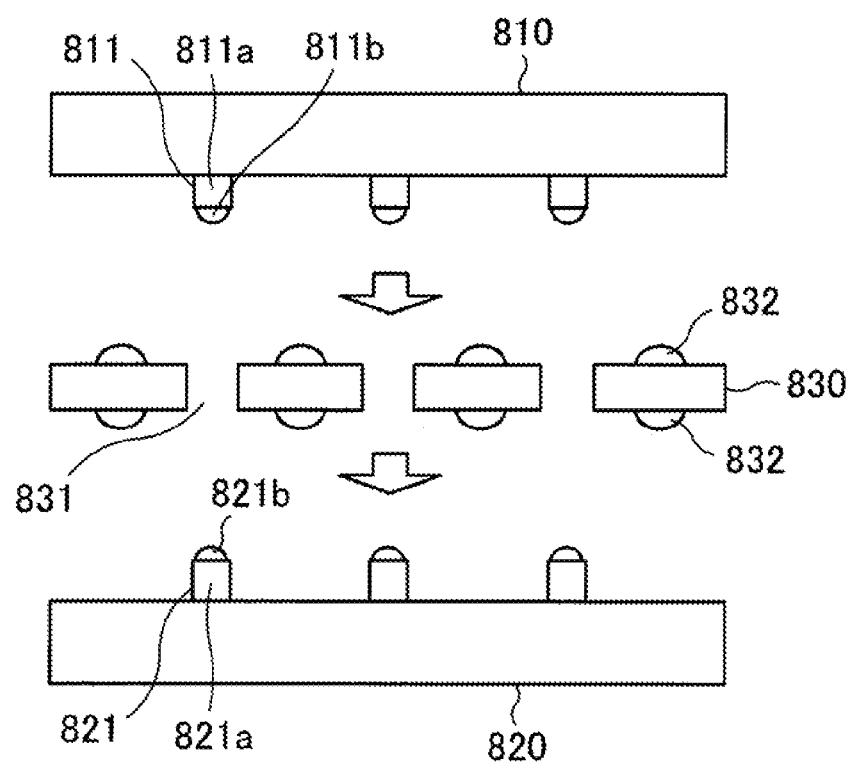
FIG. 34 illustrates a second modification.

FIG. 34 illustrates a second modification. FIG. 34 is a schematic cross-section of a principal part of the semiconductor element, the electronic element, and the substrate.

As illustrated in FIG. 34, the substrate 830 disposed between the semiconductor element 810 and the electronic element 820 may have bumps 832 on both faces. For example, when the protruding electrodes 811 and 821 are connected inside the through-holes 831, the bumps 832 on the upper face may be brought into contact with the semiconductor element 810, and the bumps 832 on the lower face may be brought into contact with the electronic element 820. When the substrate 830 is an active element, the bumps 832 on the upper and lower faces may be used as terminals connected to the semiconductor element 810 and the electronic element 820.

Figure 35A:
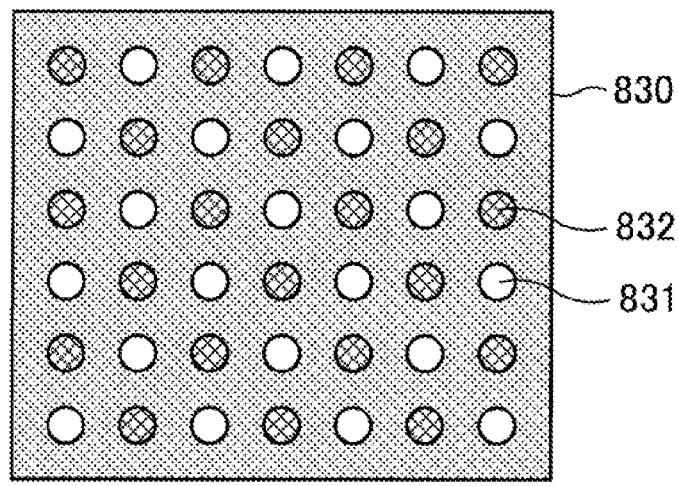
FIGS. 35A and 35B illustrate a third modification.
Figure 35B:
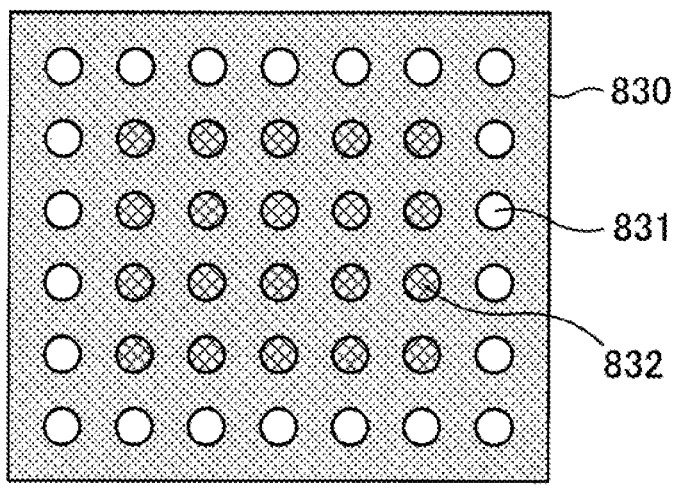

FIGS. 35A and 35B illustrate a third modification. FIGS. 35A and 35B are schematic plan views of a principal part of the substrate.

The through-holes 831 and the bumps 832 of the substrate 830 (in other words, the protruding electrodes 811 of the semiconductor element 810, the protruding electrodes 821 of the electronic element 820, and the bumps 832 of the substrate 830) may be arranged as illustrated in FIGS. 35A and 35B. For example, the through-holes 831 and the bumps 832 may be alternately arranged as illustrated in FIG. 35A. In addition, the through-holes 831 may be arranged around the outer circumference of the bumps 832 arranged in a central region as illustrated in FIG. 35B. In either case, the risks of displacement and short circuits during connecting of the semiconductor element 810 and the electronic element 820 are effectively reduced.

The through-holes 831 are not necessarily formed in the entire substrate 830, and two or more through-holes 831 formed in the substrate 830 produce some positive effects on the problems such as displacement.

Figure 36A:
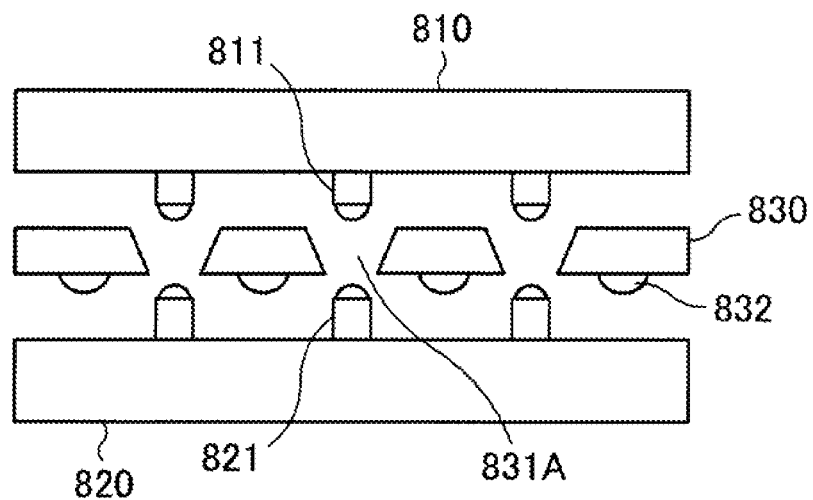
FIGS. 36A to 36C illustrate a fourth modification.
Figure 36B:
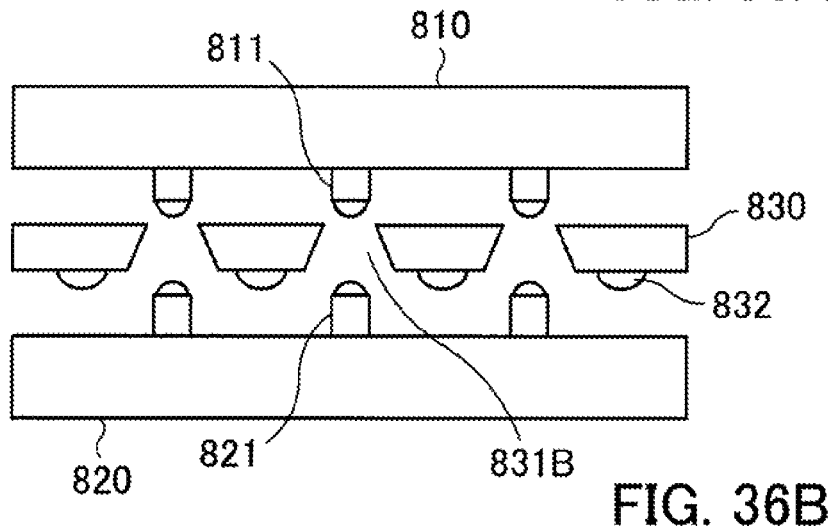
Figure 36C:
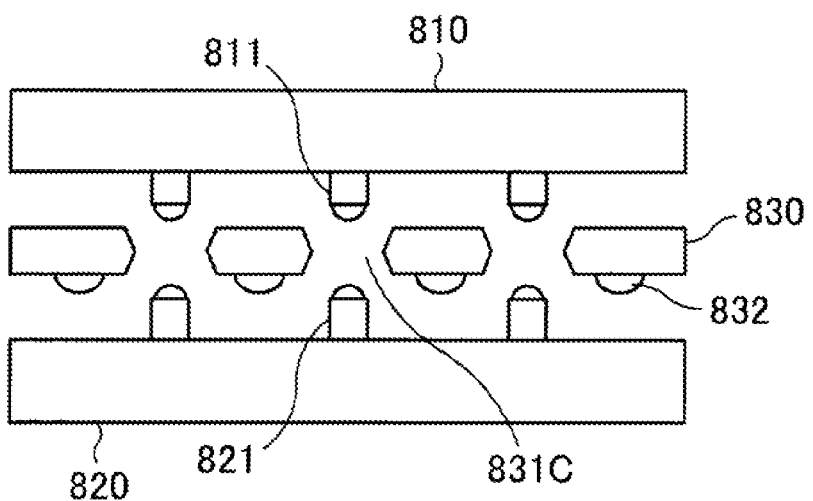

FIGS. 36A to 36C illustrate a fourth modification. FIGS. 36A to 36C are schematic cross-sections of a principal part of the semiconductor element, the electronic element, and the substrate.

The through-holes 831 formed in the substrate 830 are not necessarily cylindrical. For example, the through-holes 831 may be tapered such that the diameter of the openings adjacent to the semiconductor element 810 is larger than that of the openings remote from the semiconductor element 810 as are through-holes 831A illustrated in FIG. 36A. Alternatively, the through-holes 831 may be tapered such that the diameter of the openings adjacent to the electronic element 820 is larger than that of the openings remote from the electronic element 820 as are through-holes 831B illustrated in FIG. 36B. In addition, the through-holes 831 may be constricted between the openings adjacent to the semiconductor element 810 and the openings adjacent to the electronic element 820, the diameter of the constricted portions being smaller than those of the openings as are through-holes 831C illustrated in FIG. 36C.

The smallest diameter of the cylindrical, tapered, or constricted through-holes 831 is preferably set to equal to or greater than one time and less than two times the diameter of the protruding electrodes 811 and 821. This effectively reduces the problems such as displacement of the protruding electrodes 811 and 821 when the protruding electrodes are fitted into the through-holes 831.

Figure 37A:
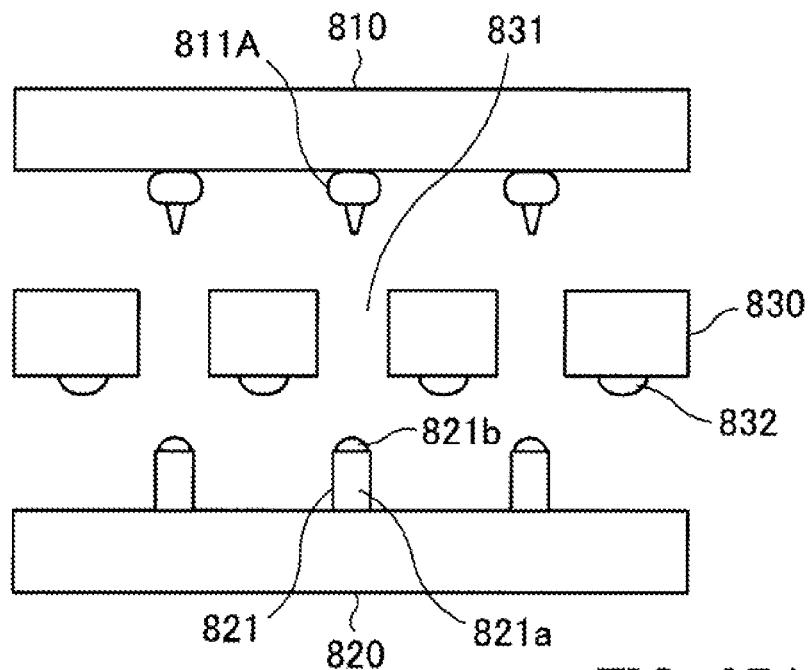
FIGS. 37A and 37B illustrate a fifth modification.
Figure 37B:
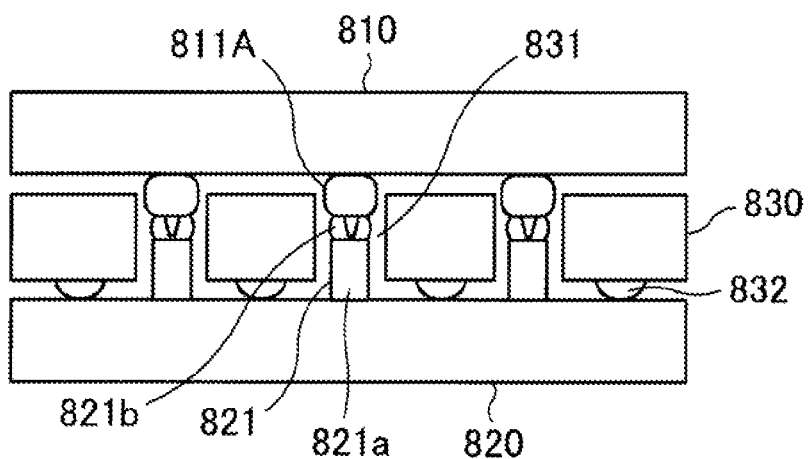

FIGS. 37A and 37B illustrate a fifth modification. FIGS. 37A and 37B are schematic cross-sections of a principal part of the semiconductor element, the electronic element, and the substrate.

The protruding electrodes 811 of the semiconductor element 810 and the protruding electrodes 821 of the electronic element 820 are not limited to post electrodes. For example, stud bumps 811A composed of, for example, Au may be used as the protruding electrodes of the semiconductor element 810, and the stud bumps 811A and the protruding electrodes 821 serving as the post electrodes of the electronic element 820 may be connected together inside the through-holes 831 via the solder portions 821b as illustrated in FIGS. 37A and 37B.

Alternatively, the protruding electrodes 811 serving as the post electrodes are used for the semiconductor element 810, and stud bumps may be used as the protruding electrodes of the electronic element 820. In addition, stud bumps may be used for both the semiconductor element 810 and the electronic element 820.

Examples of the above-described embodiments will now be described.

Example 1

A semiconductor element (hereinafter referred to as "first semiconductor element") with a size of 3.5 mm×7 mm having protruding electrodes formed thereon was prepared. The protruding electrodes each included a Cu post portion 30 μm in diameter and 35 μm in height and tin-silver (SnAg) solder 10 μm in height formed on the end of the post portion, and were arranged with a pitch of 50 μm.

Furthermore, a base substrate composed of Si (hereinafter referred to as "Si base substrate") with a size of 15 mm×15 mm having protruding electrodes formed thereon was prepared. The protruding electrodes had the same size and structure as those on the first semiconductor element, and were arranged in the same pattern as those on the first semiconductor element.

In addition, a Si substrate without an active layer was used as a semiconductor element having through-holes (hereinafter referred to as "second semiconductor element"). The second semiconductor element was formed as follows. First, holes 35 μm in diameter were formed in a face of the Si substrate by dry etching in the same pattern as the protruding electrodes of the first semiconductor element. Subsequently, the thickness of the Si substrate was reduced to 50 μm by back-grinding the rear face of the Si substrate. At this moment, the holes that had been formed in the front face in advance appeared in the rear face, resulting in through-holes. Subsequently, insulating films were formed on the rear face (ground face) of the Si substrate and inside the through-holes by low-temperature CVD or thermal oxidation. This completes the formation of the second semiconductor element. When connecting terminals are formed on this second semiconductor element, circuit patterns, bumps, and the like may be formed on the Si substrate before the through-holes and the insulating films are formed as above.

In order to mount the first semiconductor element on the Si base substrate, first, the second semiconductor element in which the through-holes were formed was mounted over the Si base substrate using a flip-chip bonder such that the through-holes of the second semiconductor element and the protruding electrodes of the Si base substrate were aligned. Next, the protruding electrodes of the first semiconductor element and the through-holes of the second semiconductor element were aligned, and the first semiconductor element was mounted using the flip-chip bonder. Subsequently, the laminate was heated to 240° C. in a reflow oven under a nitrogen atmosphere so that the Si base substrate and the first semiconductor element were connected together.

For comparison, the first semiconductor element was mounted over the Si base substrate without using the second semiconductor element having the through-holes, and the laminate was heated in the reflow oven so that the first semiconductor element and the Si base substrate were connected together.

Samples were manufactured with and without the second semiconductor element. Specifically, ten samples were manufactured in such a way that the Si base substrate and the first semiconductor element were connected using the second semiconductor element. The other ten samples were manufactured in such a way that the Si base substrate and the first semiconductor element were connected without using the second semiconductor element. Then, their electrical connections were measured. As a result, the samples using the second semiconductor element had no electrical connection failures, meaning that the Si base substrate and the first semiconductor element were able to be connected together in all the ten samples. Meanwhile, electrical connection failures were found in two out of the ten samples formed without using the second semiconductor element. This result confirmed the advantage of using the second semiconductor element for connecting the Si base substrate and the first semiconductor element.

Example 2

A base substrate composed of resin (hereinafter referred to as "resin base substrate") with a size of 35 mm×35 mm having protruding electrodes formed thereon was prepared. The protruding electrodes had the same size and structure as those of the first semiconductor element, and arranged in the same pattern as those of the first semiconductor element. The above-described first semiconductor element was mounted over the resin base substrate using the above-described second semiconductor element.

In order to do this, first, the second semiconductor element in which the through-holes were formed was mounted over the resin base substrate using a flip-chip bonder such that the through-holes of the second semiconductor element and the protruding electrodes of the resin base substrate were aligned. Next, the protruding electrodes of the first semiconductor element and the through-holes of the second semiconductor element were aligned, and the first semiconductor element was mounted using the flip-chip bonder. Subsequently, the laminate was heated to 240° C. in a reflow oven under a nitrogen atmosphere so that the resin base substrate and the first semiconductor element were connected together.

For comparison, the first semiconductor element was mounted over the resin base substrate without using the second semiconductor element having the through-holes, and the laminate was heated in the reflow oven so that the first semiconductor element and the resin base substrate were connected together.

Samples were manufactured with and without using the second semiconductor element. Specifically, ten samples were manufactured in such a way that the resin base substrate and the first semiconductor element were connected using the second semiconductor element. The other ten samples were manufactured in such a way that the resin base substrate and the first semiconductor element were connected without using the second semiconductor element. Then, their electrical connections were measured. As a result, the samples using the second semiconductor element had no electrical connection failures, meaning that the resin base substrate and the first semiconductor element were able to be connected together in all the ten samples. Meanwhile, electrical connection failures were found in two out of the ten samples formed without using the second semiconductor element. This result confirmed the advantage of using the second semiconductor element for connecting the resin base substrate and the first semiconductor element.

As described above, a substrate (semiconductor element, resin substrate, ceramic substrate, or the like) in which through-holes are formed is interposed between two electronic elements (semiconductor element, circuit board, and the like), and protruding electrodes of the two electronic elements are connected together inside the through-holes. This reduces the risk of displacement during mounting and improves the reliability of connections between the electronic elements.

In addition, even in cases where three or more electronic elements are stacked and connected, the through-holes of the intervening electronic elements (substrates) function as guides, and reduce the risk of displacement of the lower electronic elements caused by the load during stacking of the electronic elements, vibration, and other reasons. This allows the three or more stacked electronic elements to be connected by one-time reflow soldering, and thereby leads to an improvement in the productivity.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A semiconductor device comprising:
    a first semiconductor element having a first surface and a first electrode protruding from the first surface;
    an electronic element having a second surface and a second electrode protruding from the second surface; and
    a substrate disposed between the first surface and the second surface, wherein
    the substrate has a third surface opposite to the first surface, a fourth surface opposite to the second surface and a first through-hole between the third surface and the fourth surface;
    the first electrode and the second electrode are inserted in the first through-hole and connected together inside the first through-hole; and
    the second surface is apart from the fourth surface.

2. The semiconductor device according to claim 1, wherein a sidewall of the first through-hole is insulated.

3. The semiconductor device according to claim 1, wherein the first semiconductor element has a second through-hole, and
    the substrate has a third electrode protruding from the third surface and being inserted in the second through-hole.

4. The semiconductor device according to claim 1, wherein the electronic element has a recess, and
    the substrate has a fourth electrode protruding from the fourth surface and being inserted in the recess.

5. The semiconductor device according to claim 1, wherein the first electrode has a first post portion,
    the second electrode has a second post portion, and
    a connecting portion that connects an end of the first post portion and an end of the second post portion together exists inside the first through-hole.

6. The semiconductor device according to claim 1, wherein the electronic element is a second semiconductor element.

7. The semiconductor device according to claim 1, wherein the electronic element is a circuit board.

8. The semiconductor device according to claim 1, wherein the substrate is a third semiconductor element.

9. The semiconductor device according to claim 1, wherein the substrate is a circuit board, a resin substrate, or a ceramic substrate.

10. The semiconductor device according to claim 1, wherein a space between the first semiconductor element and the electronic element and a space inside the first through-hole are filled with an insulating member.

11. The semiconductor device according to claim 1, wherein a diameter of the first electrode and a diameter of the second electrode are smaller than a diameter of the first through-hole.

12. The semiconductor device according to claim 1, wherein one or both of the first electrode and the second electrode is a stud bump.

13. The semiconductor device according to claim 1, wherein the substrate has a conductive portion that is electrically connected to one or both of the first semiconductor element and the electronic element.

14. A method of manufacturing a semiconductor device, the method comprising:
    placing a substrate having a third surface, a fourth surface and a first through-hole between the third surface and the fourth surface over an electronic element having a second surface and a second electrode protruding from the second surface with the fourth surface opposing the second surface, such that the second electrode is inserted in the first through-hole;
    placing a semiconductor element having a first surface and a first electrode protruding from the first surface over the substrate with the first surface opposing the third surface, such that the first electrode is inserted in the first through-hole; and
    connecting the first electrode inserted in the first through-hole and the second electrode inserted in the first through-hole together inside the first through-hole; wherein
    the second surface is apart from the fourth surface.

15. The method according to claim 14, wherein
    the semiconductor element has a second through-hole,
    the substrate has a third electrode protruding from the third surface, and
    the placing of the semiconductor element over the substrate includes inserting the third electrode into the second through-hole while the first electrode is inserted into the first through-hole.

16. The method according to claim 14, wherein
    the electronic element has a recess,
    the substrate has a fourth electrode protruding from the fourth surface, and
    the placing of the substrate over the electronic element includes inserting the fourth electrode into the recess while the second electrode is inserted into the first through-hole.

17. The method according to claim 14, wherein
    the connecting of the first electrode and the second electrode together includes connecting an end of a first post portion included in the first electrode and an end of a second post portion included in the second electrode together inside the first through-hole by a connecting portion.

18. An electronic device comprising:
a semiconductor device; and
a circuit board over which the semiconductor device is mounted, wherein
the semiconductor device includes
- a semiconductor element having a first surface and a first electrode protruding from the first surface,
- an electronic element having a second surface and a second electrode protruding from the second surface, and
- a substrate disposed between the surface and the second surface, the substrate has a third surface opposite to the first surface, a fourth surface opposite to the second surface and a through-hole between the third surface and the fourth surface, the first electrode and the second electrode are inserted in the first through-hole and connected together inside the through-hole, and the second surface is apart from the fourth surface.

19. The semiconductor device according to claim 1, wherein
the substrate has a protrusion protruding from the fourth surface and being come into contact with the second surface, and
the second surface is apart from the fourth surface by the protrusion.

20. The semiconductor device according to claim 1, wherein the first surface is apart from the third surface.

\* \* \* \* \*